(12) United States Patent
Tange

(10) Patent No.: US 11,657,951 B2
(45) Date of Patent: May 23, 2023

(54) INTEGRATED EMBEDDED TRANSFORMER MODULE

(71) Applicant: Murata Manufacturing Co., Ltd., Nagaokakyo (JP)

(72) Inventor: Takayuki Tange, Milton Keynes (GB)

(73) Assignee: MURATA MANUFACTURING CO., LTD., Kyoto (JP)

(*) Notice: Subject to any disclaimer, the term of this patent is extended or adjusted under 35 U.S.C. 154(b) by 344 days.

(21) Appl. No.: 16/910,599

(22) Filed: Jun. 24, 2020

(65) Prior Publication Data
US 2021/0407727 A1    Dec. 30, 2021

(51) Int. Cl.
| | | |
|---|---|---|
| *H01F 17/00* | (2006.01) | |
| *H01F 17/04* | (2006.01) | |
| *H01F 27/02* | (2006.01) | |
| *H01F 27/24* | (2006.01) | |
| *H01F 27/26* | (2006.01) | |
| *H01F 27/28* | (2006.01) | |

(Continued)

(52) U.S. Cl.
CPC ......... *H01F 27/2804* (2013.01); *H01F 27/24* (2013.01); *H01F 27/327* (2013.01); *H01F 41/0206* (2013.01); *H01F 41/041* (2013.01); *H05K 1/182* (2013.01); *H01F 2027/2809* (2013.01); *H05K 2201/1003* (2013.01)

(58) Field of Classification Search
CPC .......... H01F 17/00; H01F 27/02; H01F 27/24; H01F 27/26; H01F 27/28; H01F 27/29; H01F 27/30; H01F 27/32; H01F 27/40; H01F 27/255; H01F 27/327; H01F 27/2804; H01F 41/00; H01F 41/04; H01F 41/041; H01F 41/0206; H01F 17/04; H05K 1/02; H05K 1/182; H05K 1/16

USPC ... 331/200, 83, 92, 192, 212, 213, 214, 218, 331/220, 221, 233; 174/260; 336/200, 336/83, 92, 192, 212, 213, 214, 218, 220, 336/221, 233
See application file for complete search history.

(56) References Cited

U.S. PATENT DOCUMENTS 5,781,091 A * 7/1998 Krone .................. H01F 41/041
                                                    336/200
5,847,947 A * 12/1998 Pan ..................... H01F 27/2804
                                                    336/200

(Continued)

FOREIGN PATENT DOCUMENTS

| CN | 110233028 A | 9/2019 |
|---|---|---|
| JP | 6116806 B2 | 4/2017 |

OTHER PUBLICATIONS

Tarzwell et al., "High Voltage Printed Circuit Design & Manufacturing Notebook", Sierra Proto Express, Ver 1.0, Nov. 4, 2004, pp. 1-35.

(Continued)

*Primary Examiner* — Xiaoliang Chen
(74) *Attorney, Agent, or Firm* — Keating & Bennett, LLP

(57) ABSTRACT

An embedded transformer module device includes an insulating substrate including a first side and a second side opposite to the first side and including a first cavity, a magnetic core in the first cavity, a primary winding wound horizontally around the magnetic core and having a spiral shape with more than one turn, and a secondary winding wound horizontally around the magnetic core, spaced away from the primary winding, and having a spiral shape with more than one turn.

14 Claims, 28 Drawing Sheets

(51) Int. Cl.
*H01F 27/29* (2006.01)
*H01F 27/30* (2006.01)
*H01F 27/32* (2006.01)
*H01F 27/40* (2006.01)
*H01F 27/255* (2006.01)
*H01F 41/00* (2006.01)
*H01F 41/04* (2006.01)
*H05K 1/02* (2006.01)
*H05K 1/16* (2006.01)
*H05K 1/18* (2006.01)
*H01F 41/02* (2006.01)

(56) References Cited

U.S. PATENT DOCUMENTS

| | | | | |
|---|---|---|---|---|
| 6,388,380 | B1* | 5/2002 | Minami | H05B 41/042 |
| | | | | 336/213 |
| 6,980,077 | B1* | 12/2005 | Chandrasekaran | H01F 27/255 |
| | | | | 336/212 |
| 7,256,676 | B2 | 8/2007 | Poynton | |
| 8,610,533 | B2* | 12/2013 | Nussbaum | H02M 3/1584 |
| | | | | 336/221 |
| 9,190,204 | B1* | 11/2015 | Cates, Jr. | H01F 27/24 |
| 9,979,087 | B2 | 5/2018 | Yosui | |
| 10,468,181 | B1 | 11/2019 | Vinciarelli | |
| 2002/0070835 | A1* | 6/2002 | Dadafshar | H01F 27/2804 |
| | | | | 336/200 |
| 2008/0071260 | A1* | 3/2008 | Shores | A61B 18/1206 |
| | | | | 606/34 |
| 2009/0289750 | A1* | 11/2009 | Ohsawa | H01F 38/08 |
| | | | | 336/192 |
| 2010/0103585 | A1* | 4/2010 | Mao | H01F 27/40 |
| | | | | 361/270 |
| 2012/0212919 | A1 | 8/2012 | Mano et al. | |
| 2013/0342301 | A1 | 12/2013 | Mano et al. | |
| 2014/0097926 | A1* | 4/2014 | Ono | H01F 17/0013 |
| | | | | 336/200 |
| 2014/0375262 | A1* | 12/2014 | Yamaguchi | H01Q 1/521 |
| | | | | 320/108 |
| 2015/0101854 | A1* | 4/2015 | Lee | H01F 41/046 |
| | | | | 29/606 |
| 2015/0194258 | A1* | 7/2015 | Scholz | H01F 27/2804 |
| | | | | 307/104 |
| 2016/0088754 | A1 | 3/2016 | Francis | |
| 2017/0018349 | A1* | 1/2017 | Otsubo | H01F 17/0033 |
| 2017/0148565 | A1* | 5/2017 | Zhang | H01F 27/02 |
| 2019/0075657 | A1 | 3/2019 | Esposito | |
| 2019/0279805 | A1* | 9/2019 | Af Ekström | H01F 41/0246 |
| 2020/0267871 | A1* | 8/2020 | Takahara | H05K 7/209 |
| 2020/0294708 | A1* | 9/2020 | Ishizawa | H01F 30/06 |
| 2021/0028145 | A1* | 1/2021 | Yu | H01L 21/4853 |
| 2021/0090791 | A1* | 3/2021 | Lin | H01F 27/323 |
| 2021/0249176 | A1* | 8/2021 | Liu | H01F 27/292 |
| 2022/0093320 | A1 | 3/2022 | Zha et al. | |
| 2022/0189687 | A1* | 6/2022 | Kotani | H01F 27/2804 |

OTHER PUBLICATIONS

Wang et al., "High Efficiency on Si-Integrated Microtransformers for Isolated Power Conversion Applications", IEEE Transactions on Power Electronics, vol. 30, No. 10, Oct. 2015, pp. 5746-5754.

Official Communication issued in International Patent Application No. PCT/US2021/037308, dated Oct. 7, 2021.

\* cited by examiner

INTEGRATED EMBEDDED TRANSFORMER MODULE

BACKGROUND OF THE INVENTION

1. Field of the Invention

The present invention relates to embedded magnetic component devices, and in particular to an integrated embedded transformer module with small clearance and good coupling between primary and secondary windings of the transformer.

2. Background

Power supply devices, transformers, and converters can include magnetic components such as transformer windings and magnetic cores. The magnetic components are typically the heaviest and largest components, making miniaturization and cost reduction difficult.

To address the above problems, it is known to provide low-profile transformers and inductors in which the magnetic components are embedded in a cavity in a resin substrate, such as a printed circuit board (PCB), where the necessary input and output electrical connections for the transformer or inductor are formed on the substrate surface. A PCB with a power supply device can be manufactured by adding layers of patterned copper plating and solder resist to the top and/or bottom surfaces of the PCB. The necessary electronic components for circuitry can then be surface mounted on the PCB. This allows a significantly more compact and thinner device to be built.

For example, one known packaged structure having a magnetic component that is integrated into a PCB includes an insulating substrate made of epoxy-based glass fiber and a toroidal magnetic core inserted into a cavity in the PCB. The remaining cavity is filled with a cured epoxy gel so that the magnetic component is fully covered, forming a solid substrate having an embedded magnetic core. Primary and secondary side transformer windings are formed by drilling through-holes in the substrate on the inside and outside circumferences of the toroidal magnetic component. The through holes are then plated with copper to form vias, and metallic traces are formed on the top and bottom surfaces of the substrate to connect respective vias together to define a winding and to form input and output terminals. In this way, a coil conductor is created around the magnetic component. The winding includes turns that are perpendicular with the top and the bottom surfaces of the substrate. A solder resist layer can then be added to the top and bottom surfaces of the substrate covering the metallic surface terminal lines, allowing additional electronic components to be mounted on the solder resist layer. In the case of power supply converter devices, for example, one or more transistor switching devices and associated control electronics, such as integrated circuits (ICs) and passive components, can be mounted on the solder resist layer.

Devices manufactured as described above have a number of associated problems. In particular, air bubbles can form in the epoxy gel as the epoxy gel is solidifying. During reflow soldering of the electronic components on the surface of the substrate, these air bubbles can expand and cause failure or reduce reliability of the device.

FIG. 1 shows a plan view of an integrated transformer of the related art that includes a toroidal magnetic core 105 in a ring-shaped cavity 102 in a substrate 100. The cavity 102 is slightly larger than the magnetic core 105 so that an air gap is provided around the magnetic core 105 between the magnetic core 105 and the substrate 100. The primary windings 110 of the transformer are shown on the left-hand side of the integrated transformer, and the secondary windings 120 of the transformer are shown on the right-hand side of the integrated transformer. The transformer windings 110 and 120 include outer conductive vias 111 and 121 arranged around the outer periphery of the circular cavity 102 containing the magnetic core 105, and also include inner conductive vias 112 and 122 provided in the inner or central region outside of the cavity 102. Each of the outer conductive vias 111 and 121 in the upper winding layer is connected to a single inner conductive via 112 and 122 by a metallic trace 113. The lower winding layer (not shown) of the transformer is arranged in the same way and completes the conductive paths of the transformer windings 110 and 120 around the magnetic core 105 so that turns of the transformer windings 110 and 120 are perpendicular to the top and bottom surfaces of the substrate 100.

The primary winding 110 and the secondary winding 120 of the transformer must be sufficiently isolated from one another. FIG. 1 shows that the central region of the substrate 100 forms an isolation region 130 between the primary winding 110 and the secondary winding 120. The minimum distance between the inner conductive vias 112 and 122 of the primary and secondary windings 110 and 120 is the isolation distance and is illustrated by arrow 140. The spacing between the primary and secondary side windings 110 and 120 must be at least 0.4 mm to achieve a high isolation value through a solid insulator for mains referenced voltages (250 Vrms) to meet the insulation requirements of EN/UL60950.

However, isolation performance may also be adversely affected by contamination of the cavity or the central region surface with dirt. For many products, safety agency approval is required to certify the isolation characteristics. Because the required isolation distance though air or solid insulation is large, there is a negative impact on product size. For mains reinforced voltages (250 Vrms), for example, a spacing of approximately 5 mm is required across a PCB from the primary windings to the secondary windings in order to meet the insulation requirements of EN/UL60950 in air. Additionally, transformer coupling deteriorates because of the isolation distance required between primary and secondary windings.

Accordingly, it is desirable to provide an embedded magnetic component device with improved isolation characteristics, to reduce size, and to provide a method for manufacturing such a device.

SUMMARY OF THE INVENTION

To overcome the problems described above, preferred embodiments of the present invention provide magnetic components each embedded in a substrate with windings horizontally wound around a magnetic core with a spiral shape with more than one turn, and methods for manufacturing such magnetic components.

According to a preferred embodiment of the present invention, an embedded transformer module device includes an insulating substrate including a first side and a second side opposite to the first side and including a first cavity, a magnetic core in the first cavity, a primary winding wound horizontally around the magnetic core and having a spiral shape with more than one turn, and a secondary winding wound horizontally around the magnetic core, spaced away from the primary winding, and having a spiral shape with more than one turn.

The insulating substrate can be a printed circuit board. The primary winding and the secondary winding can be separated by a plurality of insulating layers of the insulating substrate. The device can further include a primary circuit connected to the primary winding and a secondary circuit connected to the secondary winding, wherein the primary circuit and the secondary circuit can be located on one of the first side and the second side. The device can further include a thermal pillar in a second cavity of the insulating substrate that absorbs heat from one of the primary circuit and the secondary circuit.

The device can further include a shield layer between the magnetic core and one of the first side and the second side. The device can further include a shield layer between one of the first side and the second side and each of the magnetic core, the primary winding, and the secondary winding. The device can further include a resin within the first cavity that secures the magnetic core in the first cavity. The primary winding can be on two layers of the insulating substrate. The secondary winding can be on two layers of the insulating substrate.

The magnetic core can include a pillar. The magnetic core can include additional pillars spaced around the pillar. The magnetic core can include a first magnetic sheet on top of the pillar and the additional pillars and a second magnetic sheet on bottom of the pillar and the additional pillars.

The magnetic core can include a first pillar and a second pillar, the primary winding can be wound horizontally around the first pillar, and the secondary winding can be wound horizontally around the second pillar. The magnetic core can include a first magnetic sheet on top of the first pillar and the second pillar and a second magnetic sheet on bottom of the first pillar and the second pillar.

According to a preferred embodiment of the present invention, a device includes an insulating substrate including a first side and a second side opposite to the first side and including a first cavity; a magnetic core in the first cavity; a primary circuit on the first side of the insulating substrate; a primary winding wound horizontally around the magnetic core, having a spiral shape, and connected to the primary circuit; and a secondary winding wound horizontally around the magnetic core, spaced away from the primary winding, and having a spiral shape.

The device can further include a secondary circuit on the first side of the insulating substrate and connected to the secondary winding. The device can further include a thermal pillar in a second cavity of the insulating substrate. The device can further include a shield layer between the magnetic core and one of the first side and the second side. The primary winding can be on two layers of the insulating substrate. The secondary winding can be on two layers of the insulating substrate. The magnetic core can include a pillar. The magnetic core can include additional pillars spaced around the pillar. The magnetic core can include a first magnetic sheet on top of the pillar and the additional pillars and a second magnetic sheet on bottom of the pillar and the additional pillars.

The magnetic core can include a first pillar and a second pillar, the primary winding can be wound horizontally around the first pillar, and the secondary winding can be wound horizontally around the second pillar. The magnetic core can include a first magnetic sheet on top of the first pillar and the second pillar and a second magnetic sheet on bottom of the first pillar and the second pillar.

According to a preferred embodiment of the present invention, a method of manufacturing an embedded transformer module device includes providing an insulating substrate with a first side and a second side opposite to the first side, the insulating substrate including a primary winding wound horizontally around a magnetic core and having a spiral shape with more than one turn; a secondary winding wound horizontally around the magnetic core, spaced away from the primary winding, and having a spiral shape with more than one turn; and a cavity in a central portion of the primary winding and the secondary winding, installing the magnetic core in the cavity, and connecting each of the primary winding and the secondary winding to one of the first side and the second side.

The method can further include applying an adhesive to one of the first side and the second side before installing the magnetic core in the cavity. The method can further include providing additional layers to one of the first side and the second side after installing the magnetic core in the cavity. The method can further include providing a shield layer between the magnetic core and one of the first side and the second side. The method can further include providing a primary circuit and a secondary circuit on one of the first side and the second side. The method can further include providing a thermal pillar in another cavity of the insulating substrate.

The above and other features, elements, characteristics, steps, and advantages of the present invention will become more apparent from the following detailed description of preferred embodiments of the present invention with reference to the attached drawings.

DETAILED DESCRIPTION OF PREFERRED EMBODIMENTS

First Preferred Embodiment

A first preferred embodiment of the present invention of an embedded transformer module device will be described with reference to FIGS. 2-11. An embedded transformer module according to the first preferred embodiment is illustrated in FIGS. 2 and 3.

Figure 1:
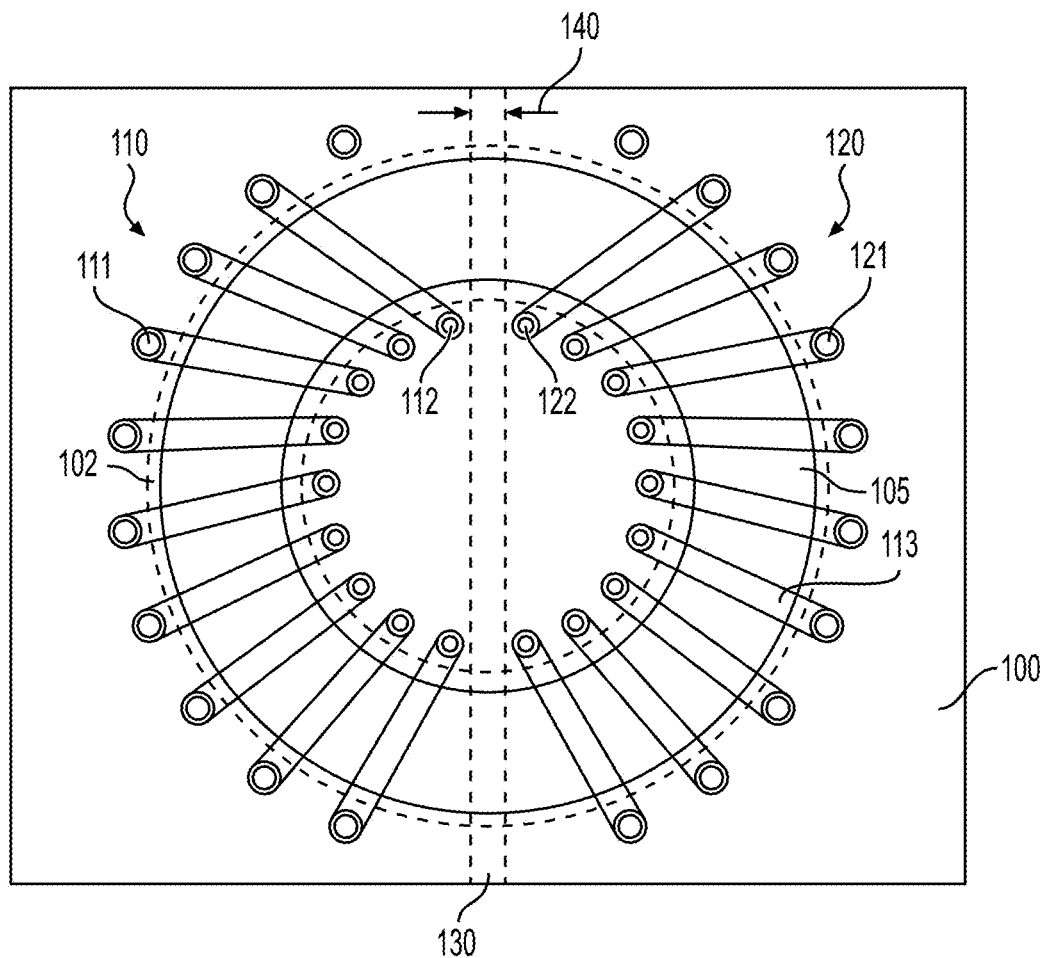
FIG. 1 shows an embedded magnetic component of the related art.
Figure 2:
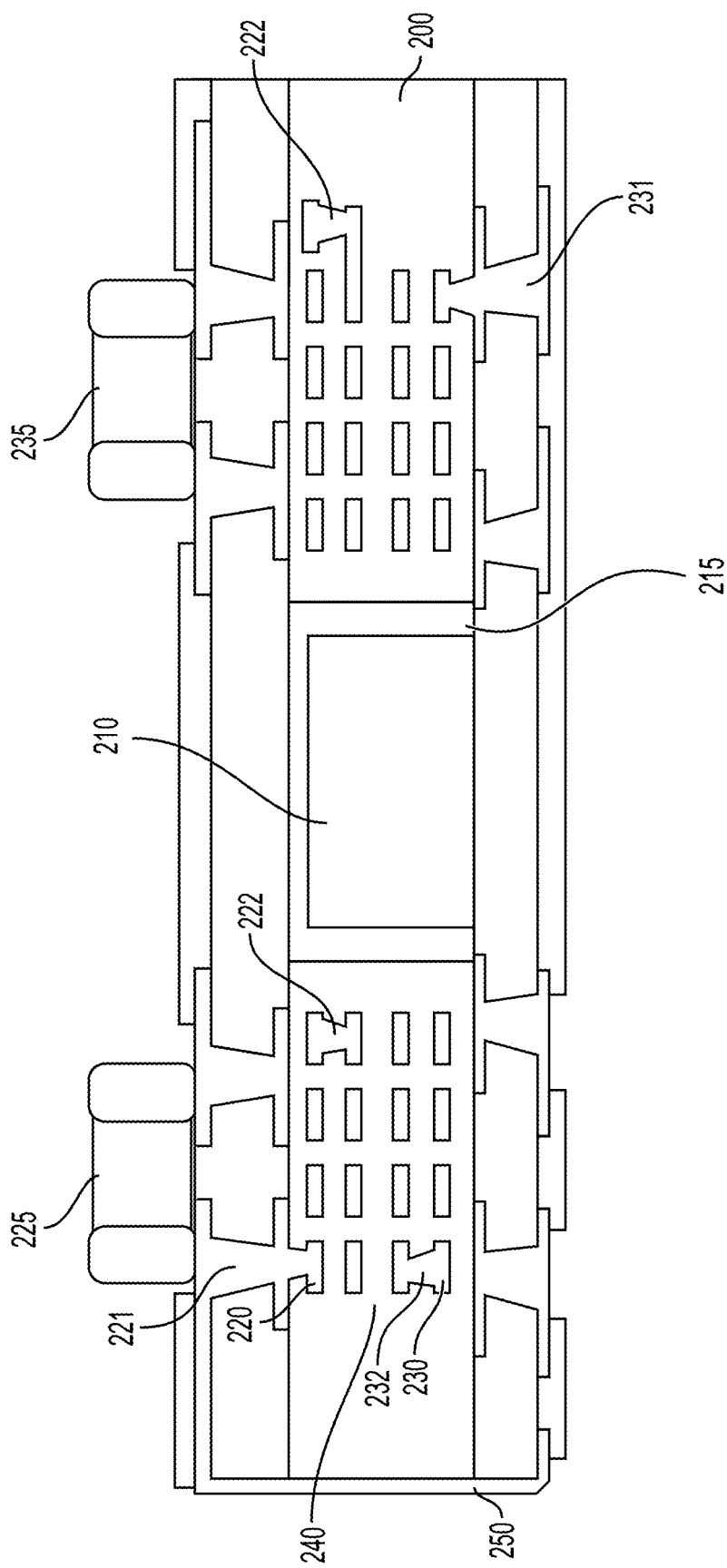
FIGS. 2 and 3 show an embedded transformer module of a first preferred embodiment of the present invention.
Figure 3:
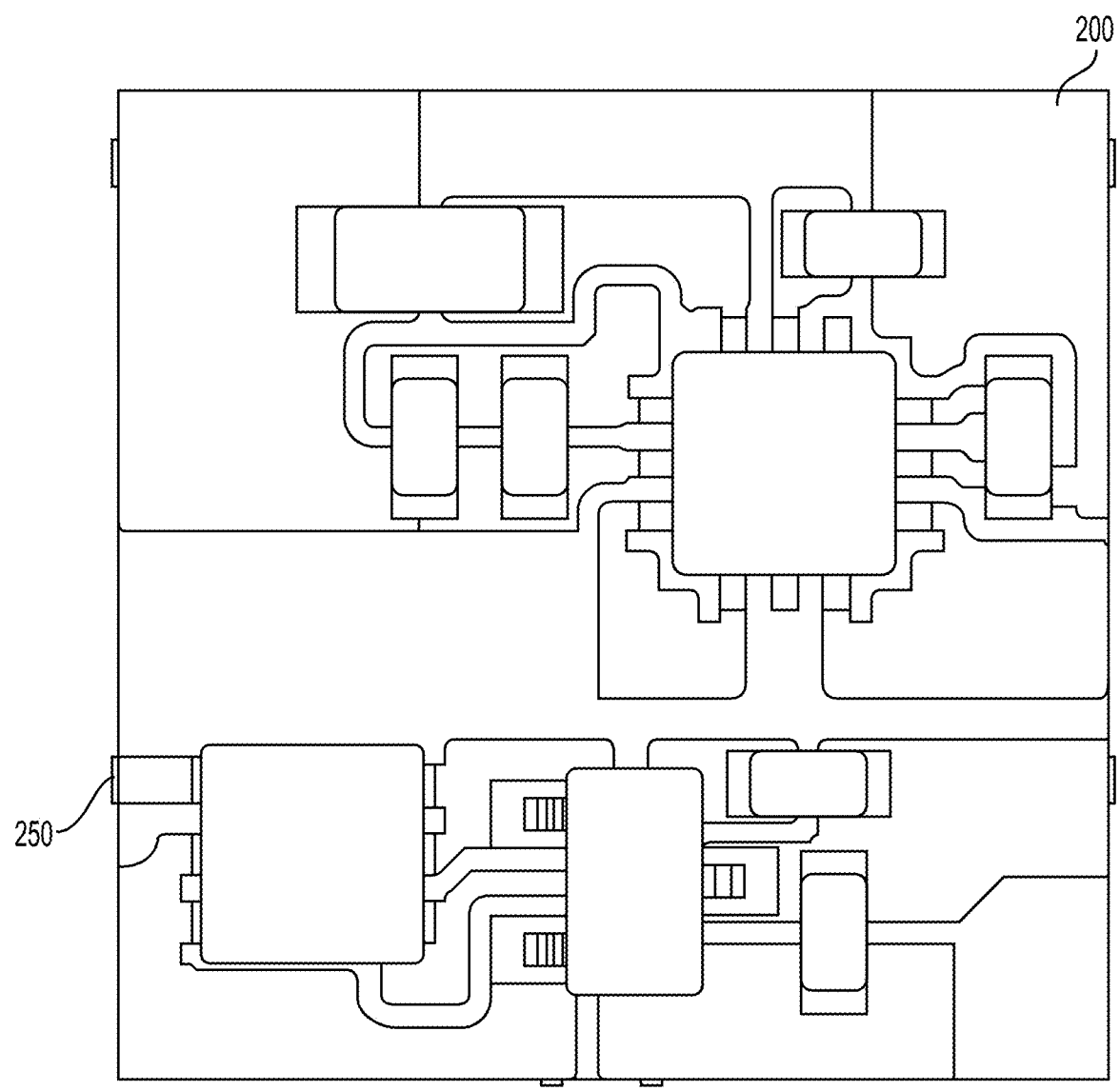
Figure 6:
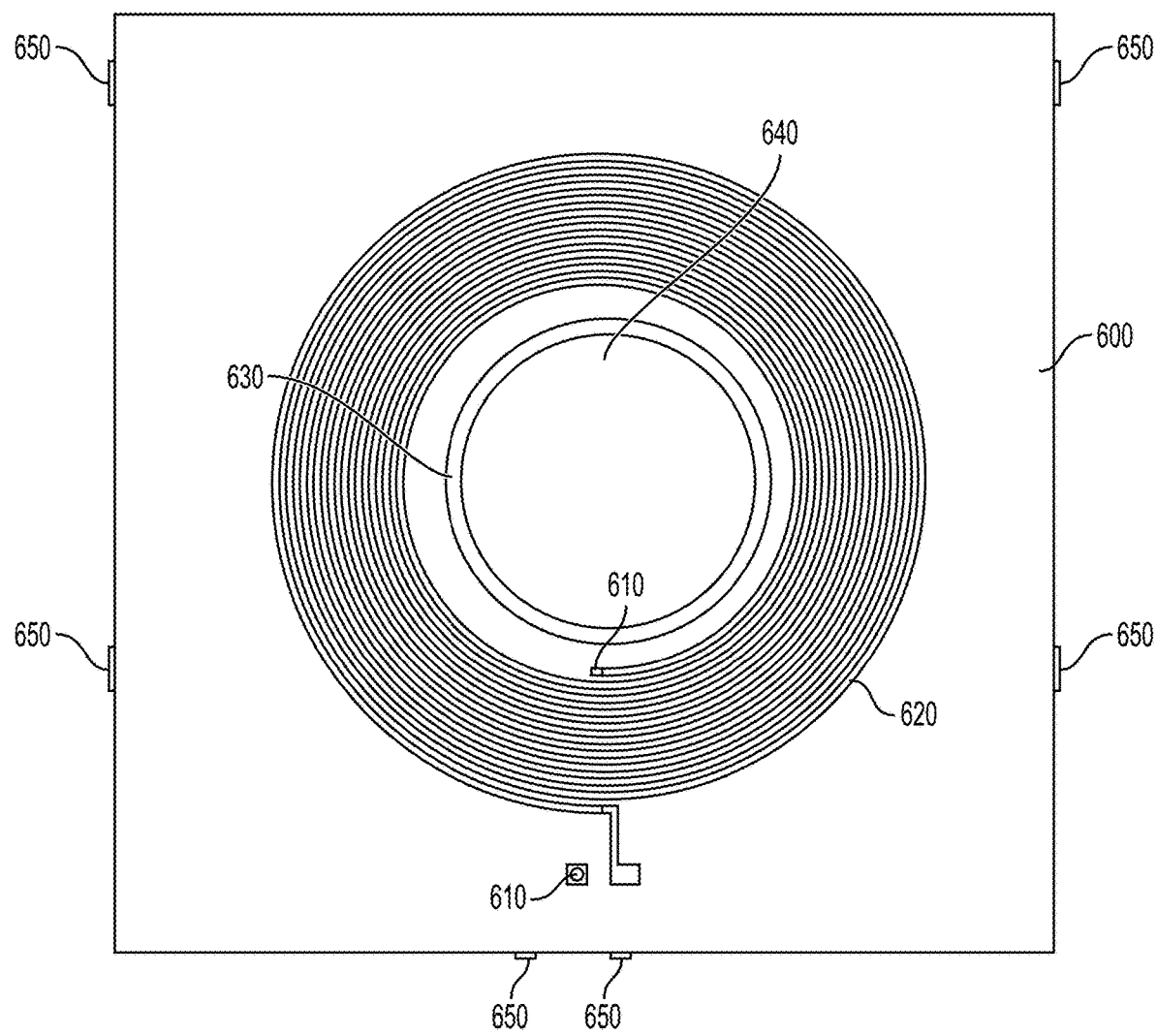

FIG. 2 is a cross section view of an embedded transformer module included in a substrate 200. As shown in FIG. 2, the embedded transformer module includes a magnetic core 210 held in place by a resin 215 and horizontal primary windings 220 and secondary windings 230 surrounding the magnetic core 210. The magnetic core 210 can include a magnetic pillar with a circular cross-section as shown in FIG. 6 (described below). Other cross-sectional shapes are also possible for the magnetic core 210, including, for example, triangle, square, rectangle, etc. Additionally, FIG. 2 shows circuitry components respectively for a primary circuit 225 and a secondary circuit 235. The circuitry components can include active components, such as transistors, and can include passive components, such as resistors, inductors, capacitors, and diodes. Although FIG. 2 shows that the primary circuit 225 and the secondary circuit 235 are located on the top surface of the substrate 200, circuit components can also be located on the bottom surface of the substrate 200. FIG. 2 shows an edge plating 250 that connects the top and bottom surfaces of the substrate 200. FIG. 3 shows a plan view of the top surface of the substrate 200 that includes the primary and secondary circuitry components. The edge platings 250 can be connected to the primary and secondary circuitry components on the top surface of the substrate 200 by traces on the top surface of the substrate 200.

The primary and secondary circuitry components can be connected to the respective primary and secondary windings through one or more of the edge plating 250, traces or other metal layers on the top and bottom surfaces of the substrate 200, and vias within the substrate 200. For example, FIG. 2 shows that the primary circuitry components are connected to the primary windings 220 by vias 221 and traces on the top surface of the substrate 200. FIG. 2 shows that the secondary windings 230 are connected to a trace or other metal layer on the bottom surface of the substrate 200. The secondary circuitry components can be connected to the trace or other metal layer on the bottom surface of the substrate by either a via or vias that extend between the top and bottom surfaces of the substrate 200 (not shown) or by an edge plating or edge platings that extend between the top and bottom surfaces of the substrate 200 (not shown).

FIG. 2 illustrates windings horizontally surrounding the pillar-shaped magnetic core 210, where the upper primary windings 220 and lower secondary windings 230 are separated by several insulation layers 240. This arrangement allows a separation of less than 0.4 mm and provides good coupling between the primary windings 220 and the secondary windings 230. For example, even by using several layers of insulation 240 between the between the primary windings 220 and the secondary windings 230, as shown in FIG. 2, the isolation distance can be reduced to about 2.3 mil (about 0.058 mm) within testing and manufacturing tolerances, depending on the insulation material used and the number of insulation layers 240.

If two or more insulation layers are used, then the insulation layers 240 can be of the same materials or of different materials. Different materials can achieve different smallest isolation distances. For example, FR4, high-temperature FR4, Bismaleimide-Triazine (BT) epoxy, polyimide, and high-voltage polyimide film (HVPF) can be used as the insulation layers 240. FR4 and high-temperature FR4 provide a dielectric strength of 800 V/mil. BT epoxy provides a dielectric strength of 1300 V/mil. Polyimide provides a dielectric strength of 900 V/mil. HVPF provides a dielectric strength of 3000 V/mil.

Two or three insulation layers 240 can be used, for example. If two insulation layers 240 are used, then each of the two insulation layers 240 can be designed to pass an electric strength test to ensure the required isolation voltage. The electric strength test of the two insulation layers 240 can include applying a test voltage that is twice the required isolation voltage, i.e., 2×the test voltage of a single layer, to each of the two insulation layers 240. FR4 and high-temperature FR4 can provide a 3-kV isolation voltage with a separation distance of 15.0 mil, i.e., two layers each with a thickness of 7.5 mil. BT epoxy can provide a 3-kV isolation voltage with a separation distance of 9.2 mil, i.e., two layers each with a thickness of 4.6 mil. Polyimide can provide a 3-kV isolation voltage with a separation distance of 13.3 mil, i.e., two layers each with a thickness of 6.7 mil. HVPF can provide a 3-kV isolation voltage with a separation distance of 4.0 mil, i.e., two layers each with a thickness of 2.0 mil.

If three insulation layers 240 are used, then all combinations of any two of the three insulation layers 240 can be designed to pass an electric strength test to ensure proper isolation. The electric strength test of the three insulation layers 240 can include applying a test voltage that is one and a half times the test voltage of a single layer, i.e., 1.5×the test voltage of a single layer, to the three insulation layers 240. FR4 and high-temperature FR4 can provide a 3-kV isolation voltage with a separation distance of 8.4 mil, i.e., three layers each with a thickness of 2.8 mil. BT epoxy can provide a 3-kV isolation voltage with a separation distance of 5.2 mil, i.e., three layers each with a thickness of 1.7 mil. Polyimide can provide a 3-kV isolation voltage with a separation distance of 7.5 mil, i.e., three layers each with a thickness of 2.5 mil. HVPF can provide a 3-kV isolation voltage with a separation distance of 2.3 mil, i.e., three layers each with a thickness of 0.8 mil.

FIG. 2 shows two layers of primary windings 220 and two layers of secondary windings 230, but any number of layers of primary windings 220 and the secondary windings 230 can be used. The different layers of primary windings 220 can be connected together by vias 222, and the different layers of the secondary windings 230 can be connected by a via 232. In FIG. 2, the two layers of primary windings 220 are adjacent to each other, and the two layers of the secondary windings 230 are adjacent to each other. Other arrangements of the primary windings 220 and the secondary windings 230 are also possible. For example, the layers of primary windings 220 and secondary windings 230 can alternate (i.e., a layer pattern of primary winding, secondary winding, primary winding, secondary winding), or the layers of secondary windings 230 can be located between the primary windings 220 (i.e., a layer pattern of primary winding, secondary winding, secondary winding, primary winding).

The primary windings 220 and the secondary windings 230 can be made by using conventional PCB fabrication techniques such as plating, etching, laminating, and the like. The insulating substrate 200 can be formed of a resin material, such as FR4. FR4 is a cost-effective composite 'pre-preg' material composed of woven fiberglass cloth impregnated with an epoxy resin binder and self-extinguishing flammability characteristics. The resin is pre-dried, but not hardened, so that when it is heated, it flows and acts as an adhesive for the fiberglass material. Although other suitable substrate or PCB materials can be used, FR4 has been found to have favorable thermal and insulation properties. The primary circuit 225 on the top surface of the substrate 200 can be connected to the primary windings 220 by a via 221. Although not shown in FIG. 2, the secondary circuit 235 on the top surface of the substrate 200 can be connected to the secondary windings 230 by through holes or by edge plating and traces.

FIGS. 4-11 are plan views of substrate layers from the bottom up that can be used to form the embedded transformer module in the substrate 200 shown in FIG. 2. The primary windings 220 are shown in the layers 800 and 900 of FIGS. 8 and 9, and the secondary windings 230 are shown in the layers 600 and 700 of FIGS. 6 and 7. The primary windings 220 and the secondary windings 230 can be separated by one or more layers of the substrate 200.

Typically, the layers of the substrate 200 are made of the same materials, but it is possible that the layer or layers between the primary windings 220 and the secondary windings 230 can be made of a different material.

Figure 4:
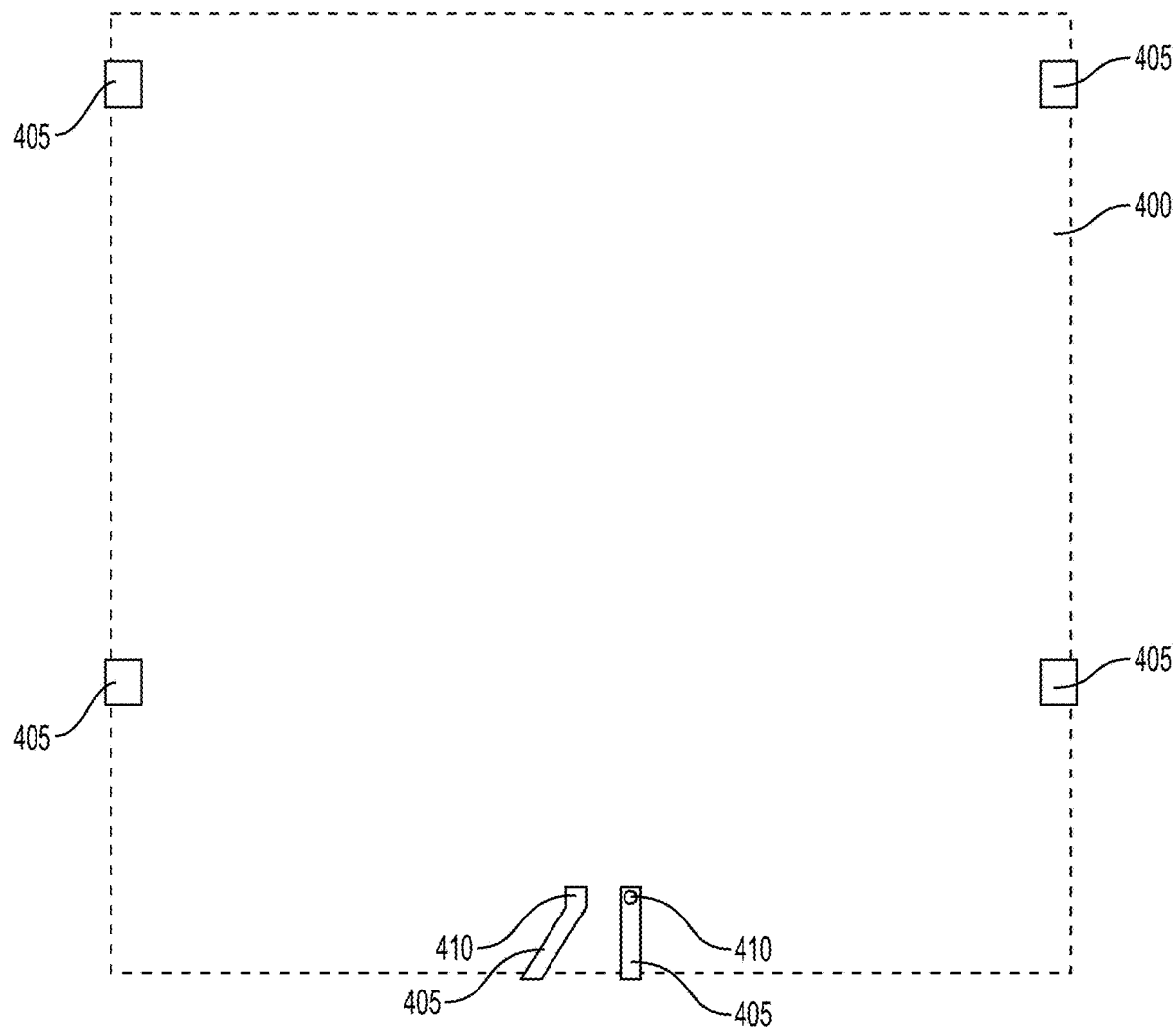
FIGS. 4-11 are plan views of substrate layers used to form the embedded transformer module shown in FIG. 2.
Figure 5:
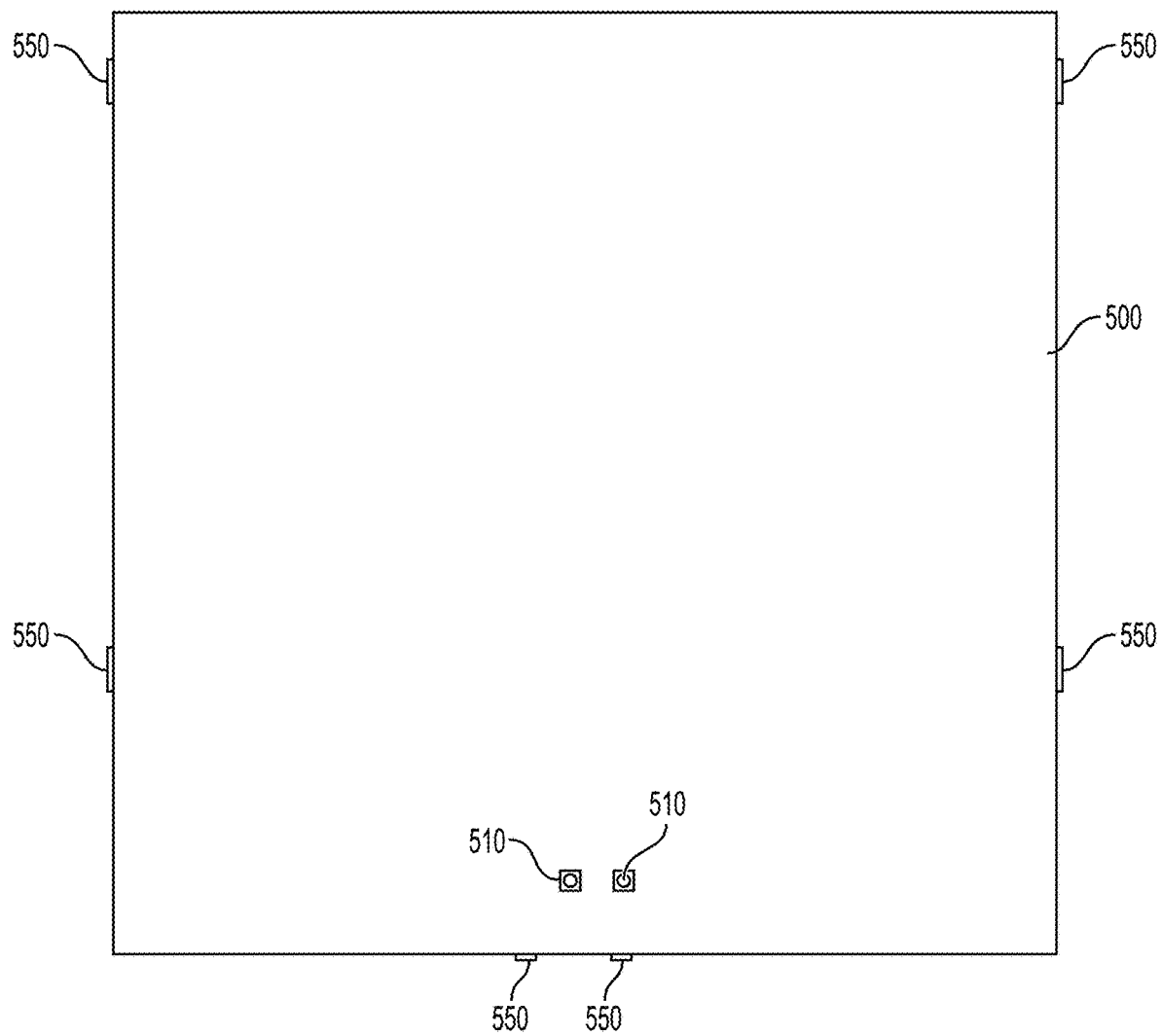

FIG. 4 shows a bottom layer 400 with metal patterns 405 and vias 410. The metal patterns 405 can be connected to corresponding edge platings on sides of the substrate. FIG. 5 shows a layer 500 on top of layer 400 with two vias 510 and edge plating 550. The two vias 510 provide an input and an output of the secondary windings. The two vias 510 can be located on the same side of the layer 500 as shown in FIG. 5 or can be located on different sides of the layer 500.

FIG. 6 shows a layer 600 on top of layer 500 with vias 610 at ends of a spiral-shaped secondary winding 620, a resin 630 around a magnetic core 640, and edge platings 650. Although FIG. 6 shows a circular spiral shape, any shape spiral can be used, including, for example, triangle, square, rectangle, etc. The secondary winding 620 can include any number of turns, including, for example, more than one turn or at least two turns. The cross-section of the magnetic core 640 can have the shape of a circle as shown in FIG. 6 or can have any other suitable shape, including, for example, triangle, square, rectangle, etc. The spiral shape of the secondary winding 620 and the shape of the cross-section of the magnetic core 640 can be the same or substantially the same within manufacturing tolerances or can be different. The via 610 in the interior of the secondary winding 620 can be located on the same side of the layer 600 as the via 610 on the exterior of the secondary winding 620 as shown in FIG. 6 or can be located on different sides of the layer 600.

Figure 7:
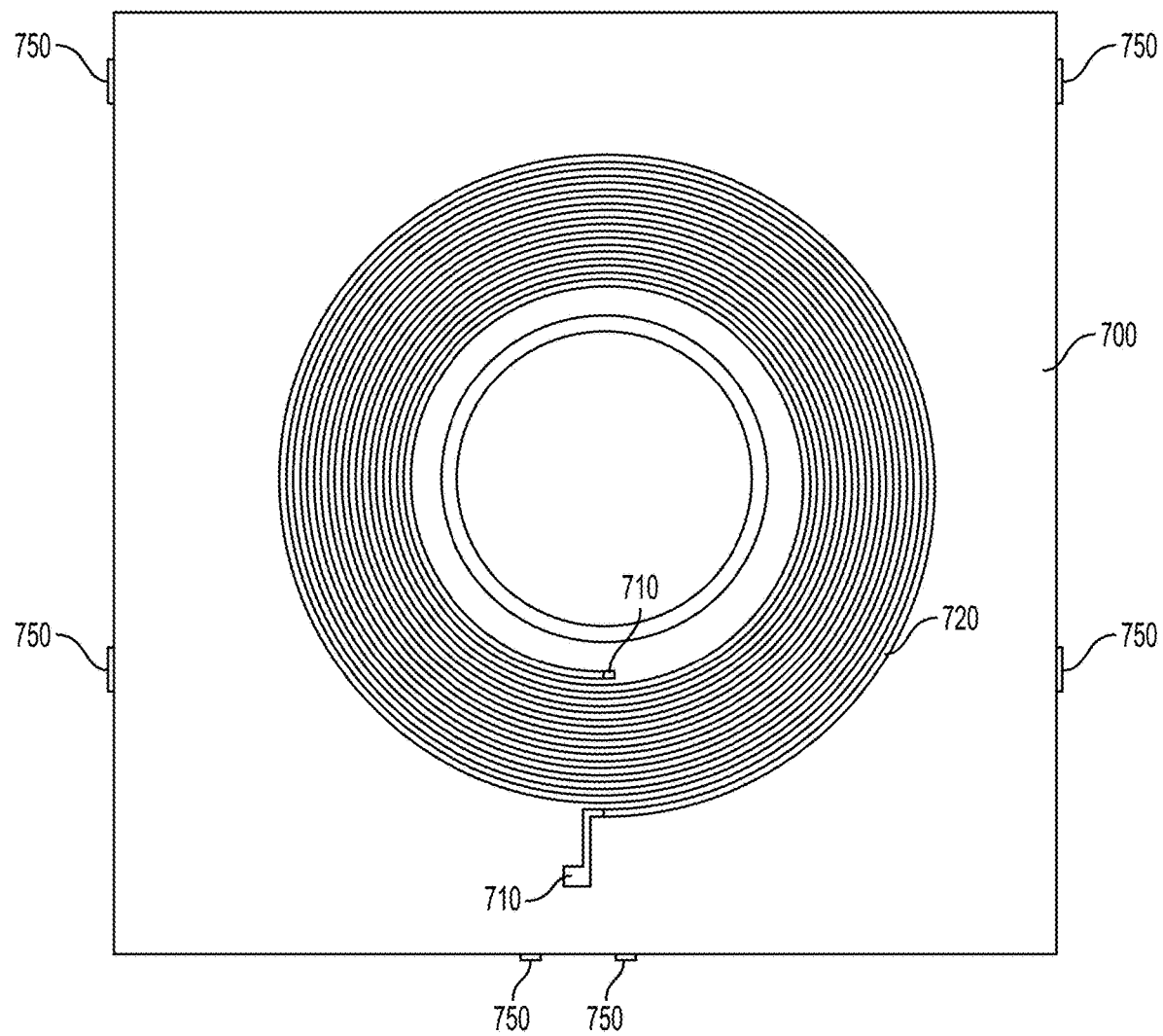

FIG. 7 shows a layer 700 on top of layer 600 with vias 710 at ends of a spiral-shaped secondary winding 720, and edge platings 750. The spiral shape of the secondary windings 620 and 720 can be the same or substantially the same within manufacturing tolerances or can be different. The number of turns in the secondary windings 620 and 720 can be the same or different.

Figure 8:
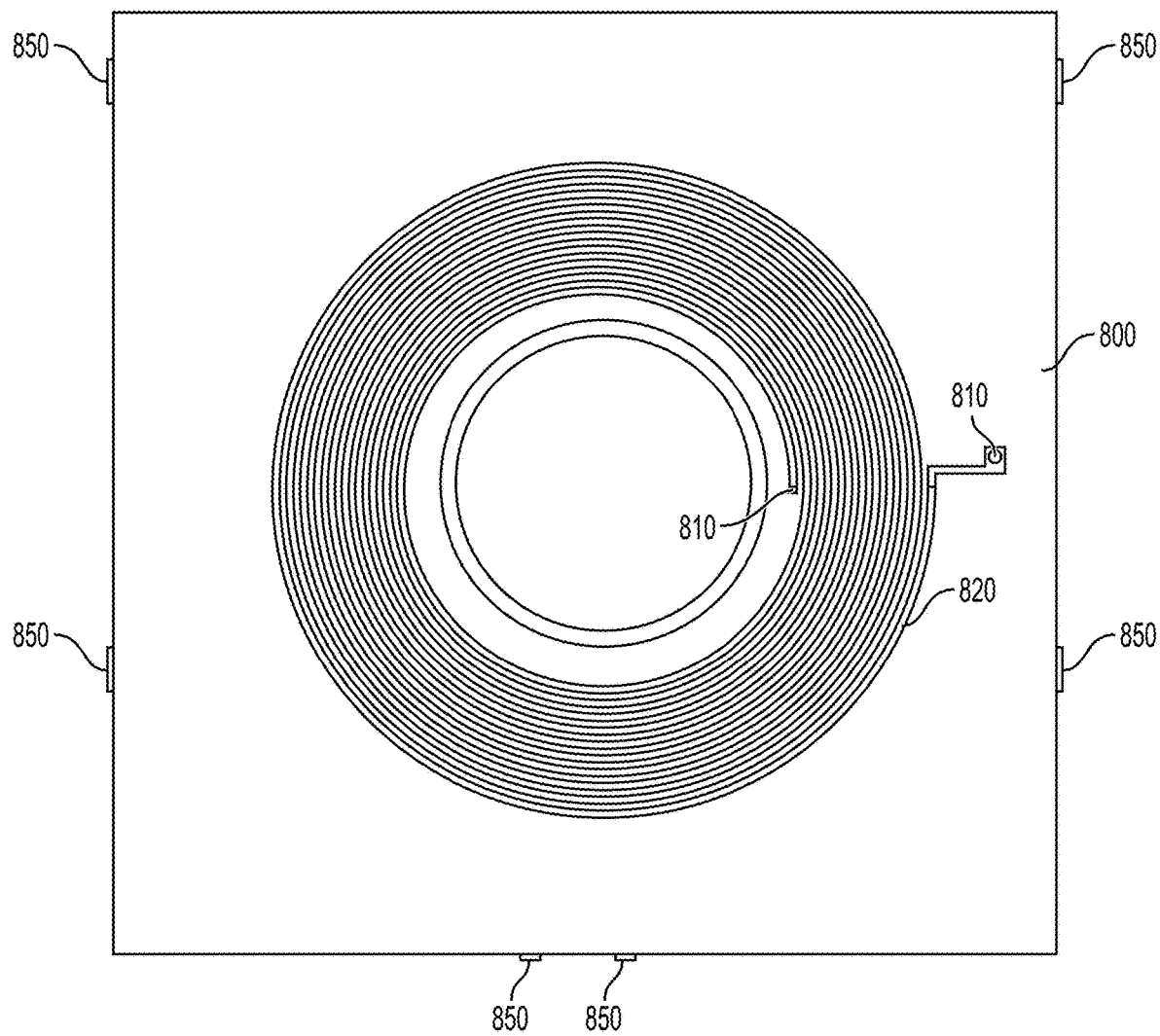

FIG. 8 shows a layer 800 on top of layer 700 with vias 810 at ends of a spiral-shaped primary winding 820 and edge plating 850. Although FIG. 8 shows a circular spiral shape, any shape spiral can be used, including, for example, triangle, square, rectangle, etc. The primary winding 820 can include any number of turns, including, for example, more than one turn or at least two turns. The spiral shape of the primary and secondary windings can be the same or substantially the same within manufacturing tolerances or can be different. The number of turns in the primary and secondary windings can be the same or different.

Figure 9:
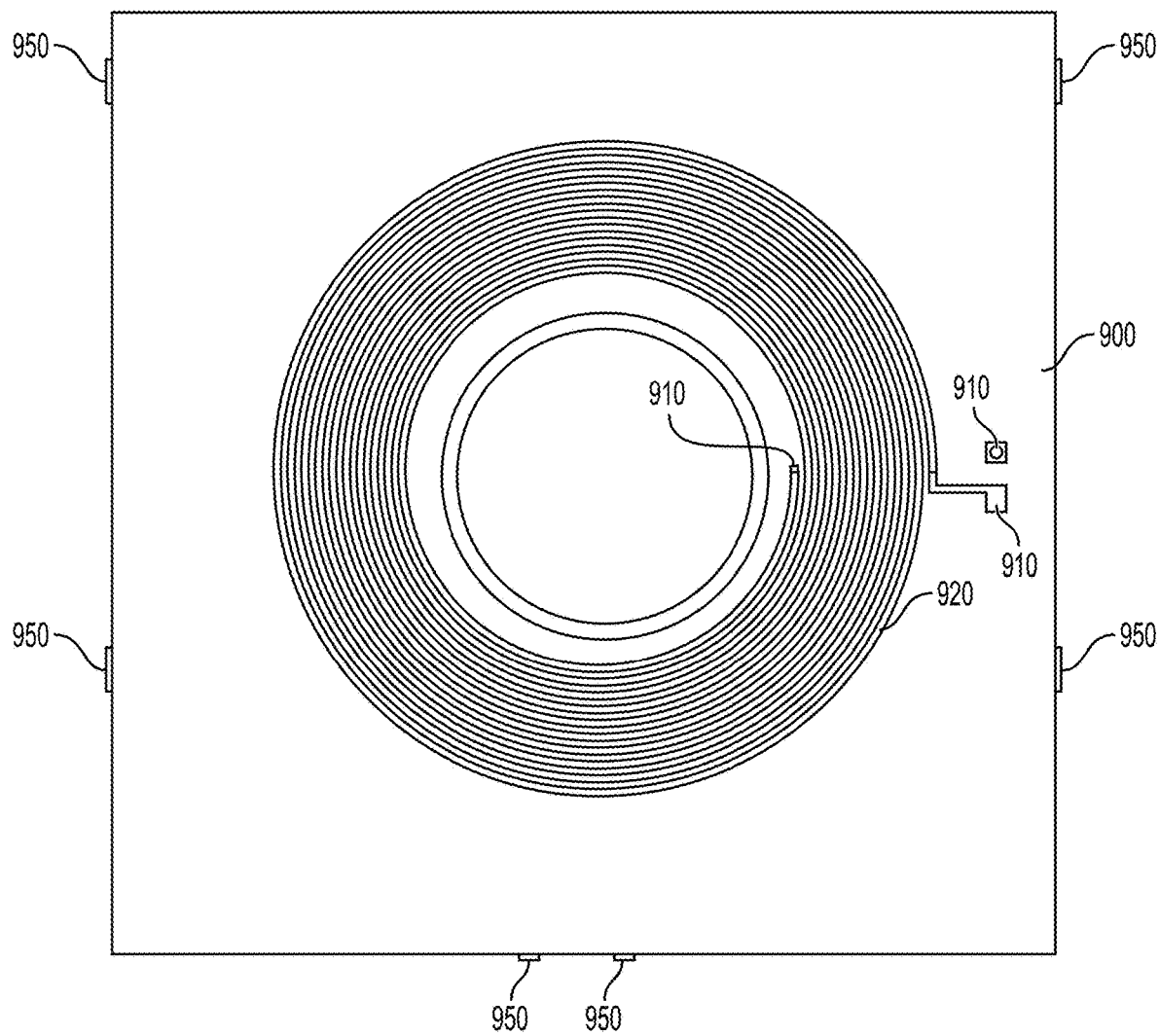

FIG. 9 shows a layer 900 on top of layer 800 with vias 910 at ends of a spiral-shaped primary winding 920, and edge plating 950. The spiral shape of the primary windings 820 and 920 can be the same or substantially the same within manufacturing tolerances or can be different. The number of turns in the primary windings 820 and 920 can be the same or different. The via 910 in the interior of the primary winding 920 can be located on the same side of the layer 900 as the via 910 on the exterior of the primary winding 920 as shown in FIG. 9 or can be located on different sides of the layer 900. As shown in FIGS. 6 and 9, the vias 610 and 910 can be offset by 90°, but the vias 610 and 910 can be offset by any amount.

Figure 10:
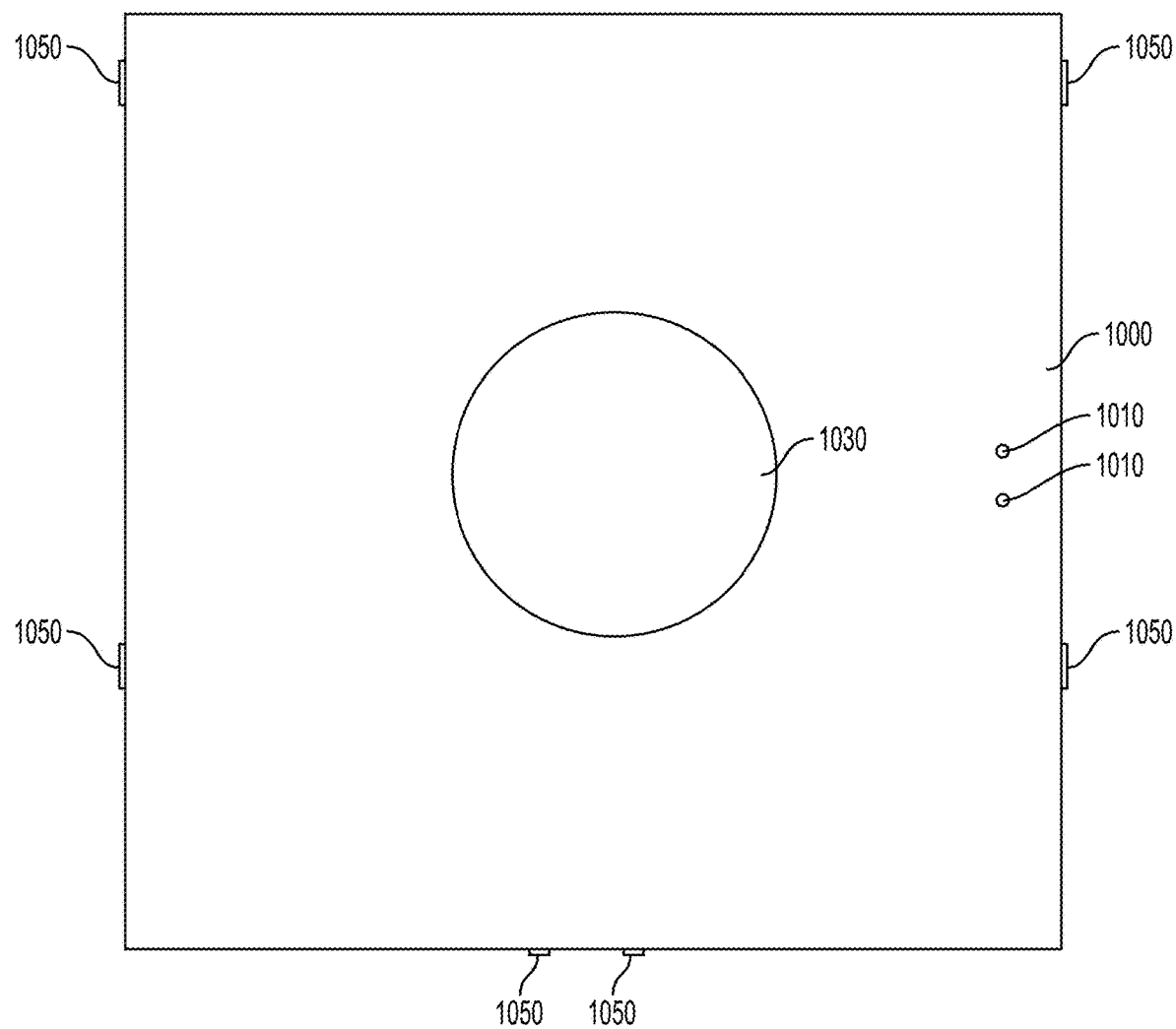
Figure 11:
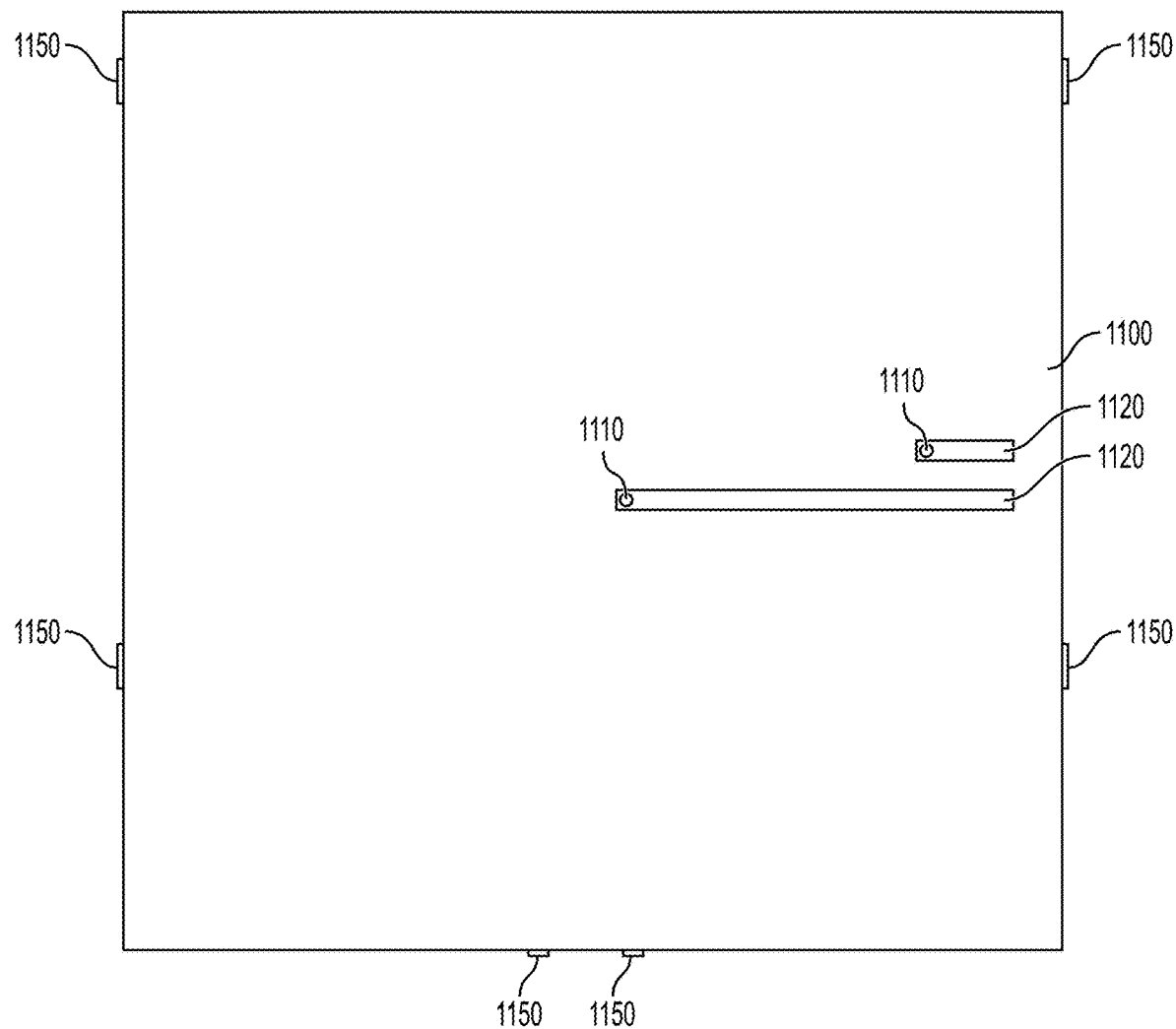

FIG. 10 shows a layer 1000 on top of layer 900 with two vias 1010 and a resin filled portion 1030 that covers the magnetic core. The two vias 1010 provide an input and an output of the primary windings. The two vias 1010 can be located on the same side of the layer 1000 as shown in FIG. 10 or can be located on different sides of the layer 1000. FIG. 11 shows a layer 1100 on top of layer 1000 with metal patterns 1120, vias 1110, and edge platings 1150. The vias 1110 are connected to a trace or other metal layer on the top surface the substrate. Edge plating can be performed after all of the substrate layers have been patterned and laminated. The edge plating can be connected between the secondary windings to the secondary components on an outside layer of the substrate and connecting board mounted terminals used to connect to outside circuitry. Some of the edge platings can be input/output (I/O) pins that can be connected to a host substrate (not shown).

Insulation layers are typically included between the windings and metal pattern layers. More than one insulation layer can be included between the primary windings 220 (including primary windings 820 and 920) and the secondary windings 230 (including secondary windings 620 and 720) to provide additional electrical isolation. Additional substrate layers can be included on top and bottom of the layers that form the embedded transformer module to include conductive traces, solder resist, and pads used to interconnect and mount the primary and secondary circuits 225 and 235. A more detailed description of a method of manufacturing an embedded transformer module according to a preferred embodiment of the present invention is provided below with respect to FIGS. 27A and 27B.

Figure 12:
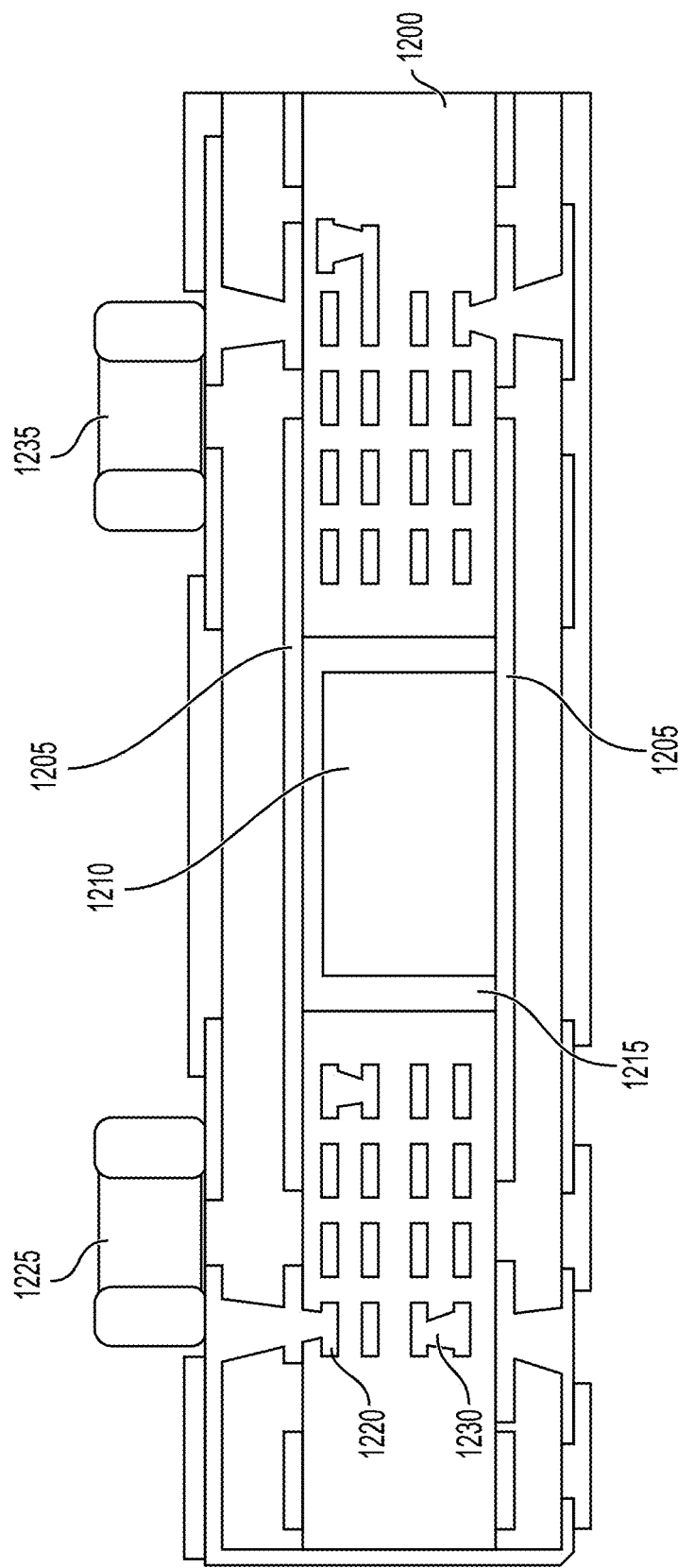
FIGS. 12 and 13 show alternative arrangements of the first preferred embodiment shown in FIG. 2.
Figure 13:
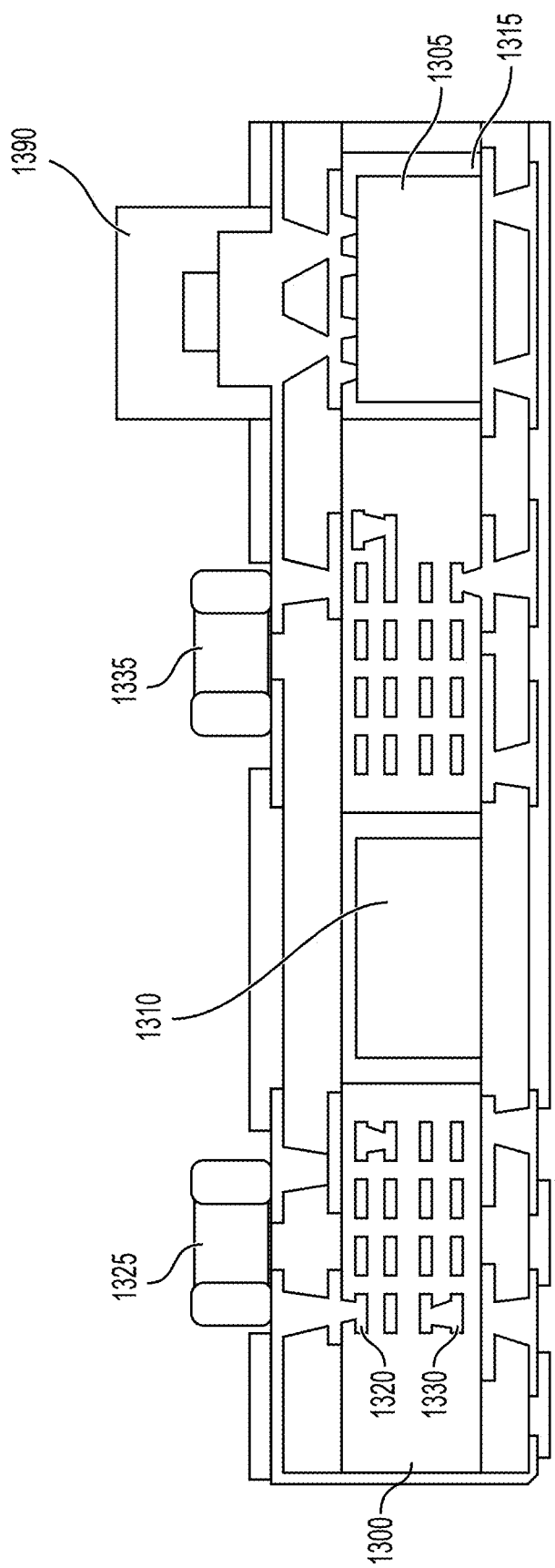

Alternative arrangements of the first preferred embodiment are shown in FIGS. 12 and 13. Like the embedded transformer module shown in FIG. 2, the configurations shown in FIGS. 12 and 13 both respectively include substrates 1200, 1300, a magnetic core 1210, 1310 held in place by a resin 1215, 1315, horizontal primary windings 1220, 1320 and secondary windings 1230, 1330 surrounding the magnetic core 1210, 1310, and circuitry components for a primary circuit 1225, 1325 and a secondary circuit 1235, 1335.

The embedded transformer module shown in FIG. 12 further includes a shield layer 1205 that can be located at the top and/or bottom of the magnetic core 1210. The shield layer 1205 can be patterned like a mesh or a sheet and can be made from copper, aluminum, or any other suitable metal or alloy. The shield layer 1205 can be located to partially or completely overlap the magnetic core 1210 and the primary and secondary windings 1220, 1230.

The embedded transformer module shown in FIG. 13 further includes a thermal pillar 1305. The thermal pillar 1305 can be made from copper, aluminum, or any other suitable metal, alloy, or other thermally conductive material and can be used as a heat sink to direct heat away from and dissipate heat generated by components of the primary or secondary circuits 1325 and 1335. Although one thermal pillar 1305 is shown in FIG. 12, any number of thermal pillars can be used. For example, one thermal pillar could be used for the components of the primary circuit 1325, and another thermal pillar could be used for the components of the secondary circuit 1335. The thermal pillar 1305 can have any suitable shape and can have a height similar to the magnetic core 1310. The thermal pillar 1305 can be inserted into a cavity in the substrate 1300 in a process like that of inserting the magnetic core 1310. The thermal pillar 1315 can be held in place with a resin 1315 like that used to secure the magnetic core 1310. The thermal pillar 1305 can be connected to substrate layers by a via or a plated through hole. Heat generated by a field-effect transistor (FET), diode, integrated circuit (IC), or any other circuit component 1390 can be spread through the thermal pillar 1305 so the transformer module device can be capable of operating at higher current with improved reliability.

Second Preferred Embodiment

A second preferred embodiment of the present invention of an embedded transformer module device will now be described with reference to FIGS. 14-26. Embedded transformer modules according to the second preferred embodiment are illustrated in FIGS. 14 and 15.

Figure 14:
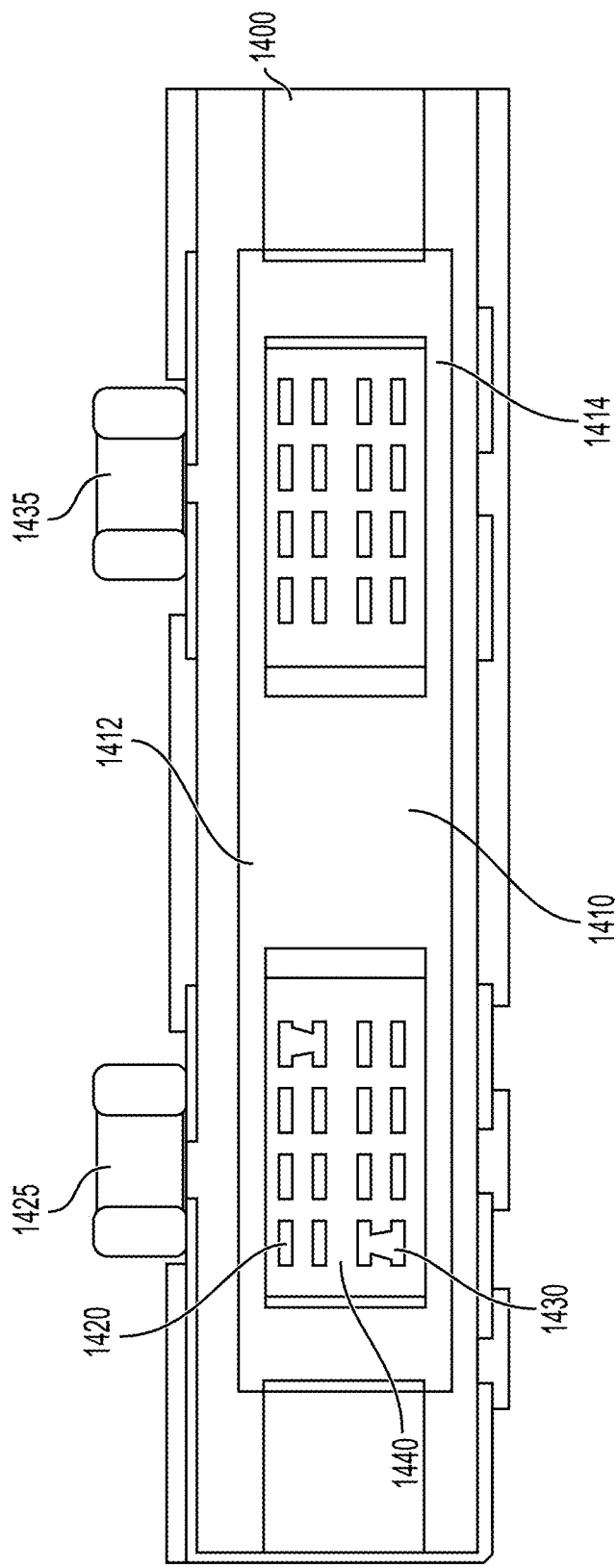
FIGS. 14-16 show an embedded transformer module of a second preferred embodiment of the present invention.
Figure 15:
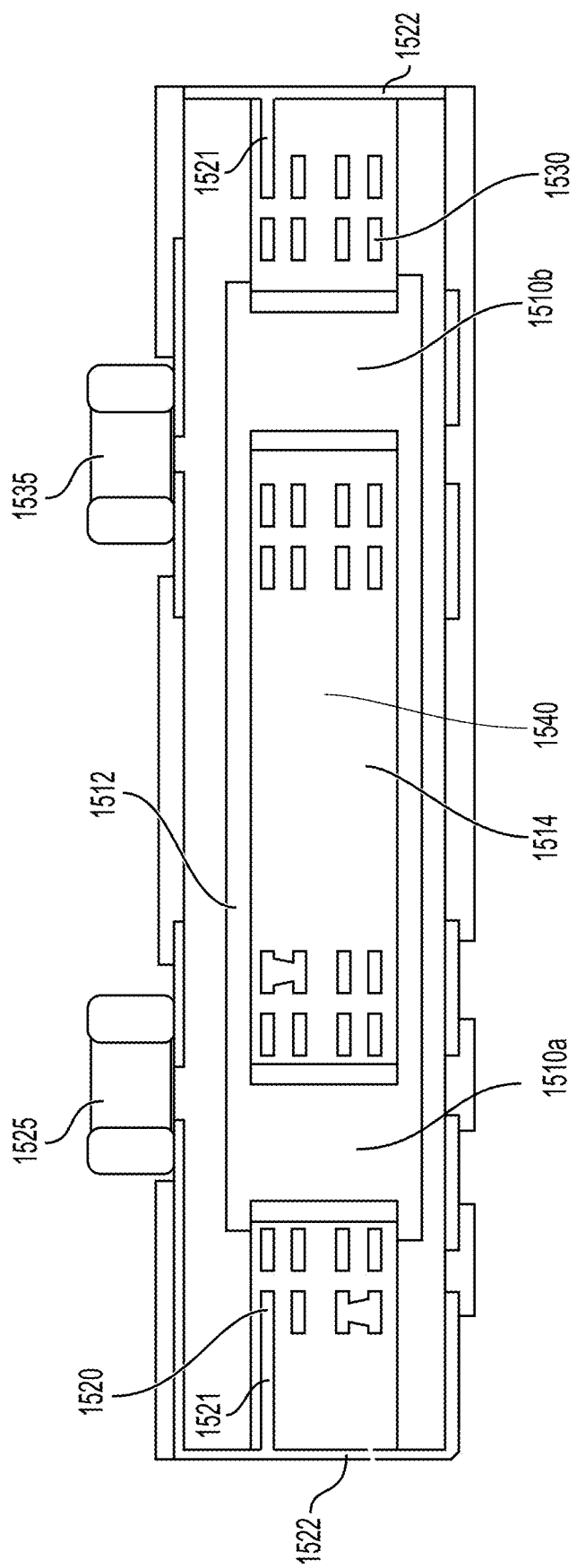

In the arrangements shown in FIGS. 14 and 15, the embedded transformer modules are similar to the embedded transformer modules of the first preferred embodiment in that primary and secondary windings are also provided with PCB fabrication techniques around more than one magnetic core pillar and separated by a distance with insulating material as previously described. In addition, magnetic sheets are provided on top and bottom of the magnetic core pillars, covering all of the magnetic core pillars when viewed from top or bottom to form closed loops of magnetic flux. If the magnetic sheets completely cover the primary and secondary windings when viewed from the top and/or bottom, then the primary and secondary windings and the primary and secondary circuits can be connected to traces in the substrate that extend outside of the magnetic sheets when viewed from the top and/or bottom. The traces can be connected to edge platings on the side of the substrate or can be connected to vias located outside of the magnetic sheets when viewed from the top and/or bottom. If the magnetic sheets do not completely cover the primary and secondary windings when viewed from the top and/or bottom, then the primary and secondary windings and the primary and secondary circuits can be connected by vias. Alternatively, the primary and secondary windings and the primary and secondary circuits can be connected by traces in the substrate and edge platings on the side of the substrate. These configurations with several magnetic core pillars and magnetic sheets create closed loop magnetic flux and provide improved inductance and EMI characteristics.

Figure 20:
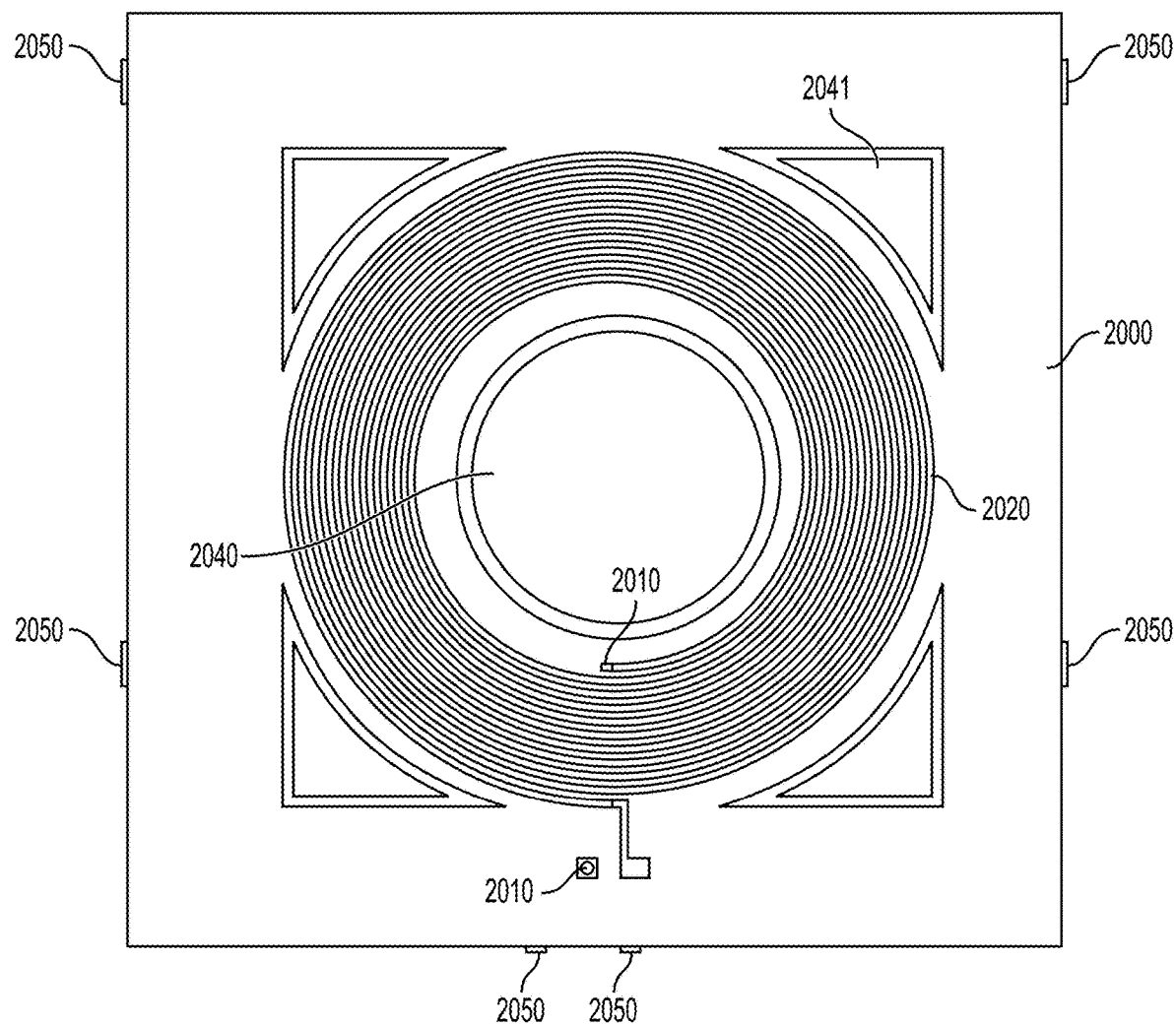

FIG. 14 is a cross section view of an embedded transformer module in substrate 1400 with an E-shaped core arrangement. The cross section view of FIG. 14 shows the embedded transformer module with a magnetic core 1410 and three pillars and with an insulating layer 1440 between horizontal primary windings 1420 and horizontal secondary windings 1430. The embedded transformer module of FIG. 14 can include a central pillar with additional pillars around the central pillar. For example, as shown in FIG. 20, the embedded transformer module can include a central pillar and four additional pillars around the central pillar. The central pillar can have a circular cross-section or any suitably shaped cross-section, including, for example, triangle, square, rectangle, etc. The additional pillars can have a triangle-like cross-section or any suitably shaped cross-section.

FIG. 15 is a cross section view of an embedded transformer module in substrate 1500 with a ring-shaped core arrangement. As shown in FIG. 15, the embedded transformer module includes a magnetic core with a first pillar 1510a and a second pillar 1510b and includes an insulating layer 1540 between the first pillar 1510a and the second pillar 1510b and between the horizontal primary windings 1520 and secondary windings 1530. The primary windings 1520 are arranged around the first pillar 1510a, and the secondary windings 1530 are arranged around the second pillar 1510b. Additionally, it is possible that one of the primary and secondary windings 1520, 1530 can be wound in a clockwise direction around the corresponding pillar 1510a, 1510b and that the other one of the primary and secondary windings 1520, 1530 can be wound in a counterclockwise direction around the corresponding pillar 1510b, 1510a.

In the arrangements of FIGS. 14 and 15, magnetic core pillars are inserted into the respective substrates in which winding, insulation, and surface layers are manufactured by conventional PCB processes. Magnetic sheets 1412, 1414 and 1512, 1514 are attached to the top and bottom of the magnetic core pillars.

FIG. 15 shows an alternative connection between the primary circuit 1525 and the primary winding 1520. As shown in FIG. 15, instead of using vias to connect the primary circuit 1525 and the primary winding 1520, traces 1521 and edge platings 1522 can be used to connect the primary circuit 1525 and the primary windings 1520. Although not shown in FIG. 15, the secondary windings 1530 can also be connected to the secondary circuit 1535 by traces and edge platings 1522. These alternative connections between the primary circuit and the primary windings and between secondary circuit and the secondary windings can be applied to the other preferred embodiments of the present invention.

Figure 16:
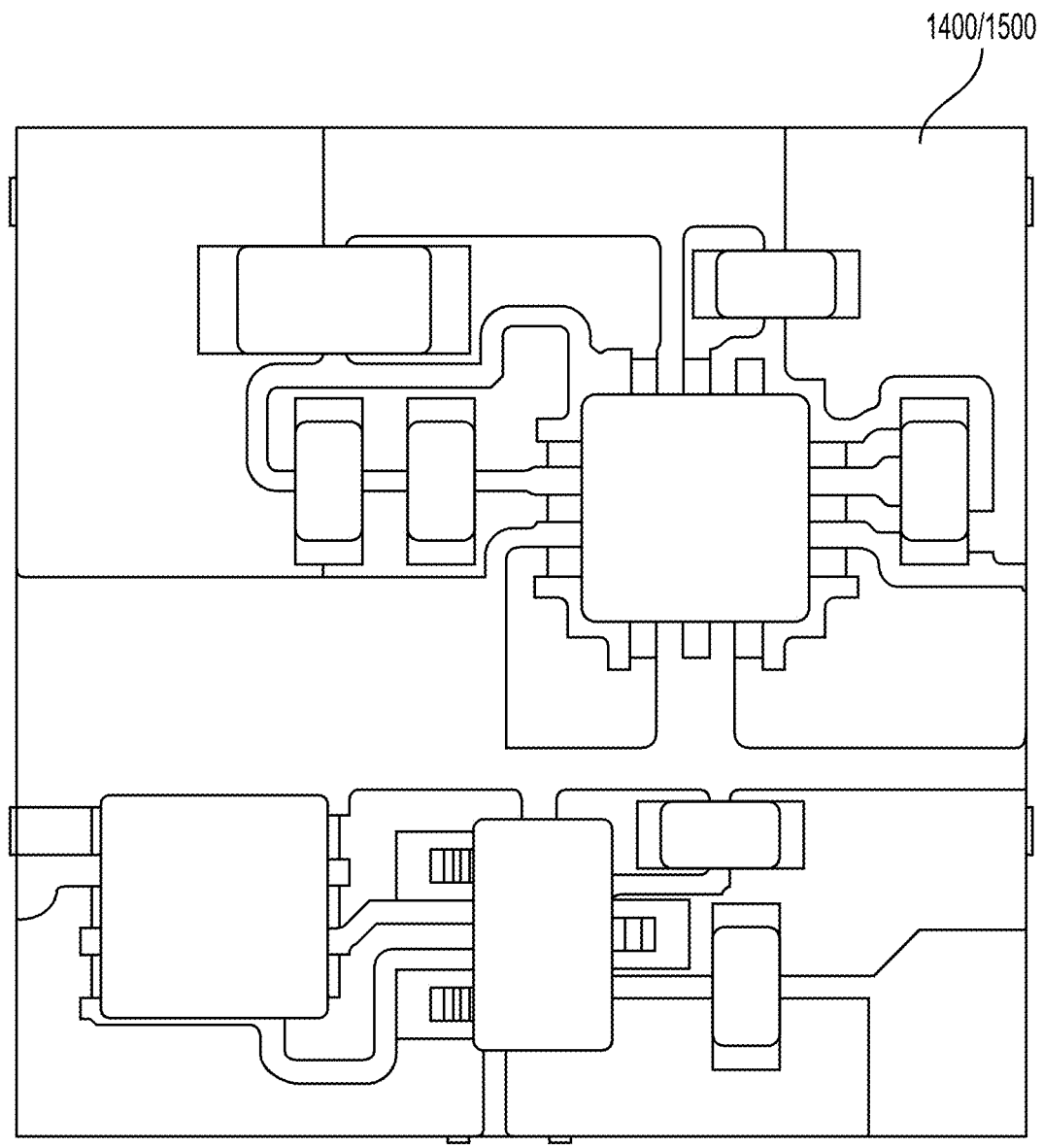

Similar to FIG. 2, FIGS. 14 and 15 show circuitry components, respectively, for primary circuits 1425, 1525 and secondary circuits 1435, 1535. FIG. 16 shows a plan view of the top surface of a respective substrate 1400/1500 that includes the primary and secondary circuitry components.

FIGS. 17-26 are plan views of substrate layers from the bottom up that can be used to form the embedded transformer module shown in the substrate 1400 of FIG. 14. The embedded transformer module shown in FIG. 15 can be similarly constructed. The primary windings 1420 are shown in the layers 2000 and 2100 of FIGS. 20 and 21, and the secondary windings 1430 are shown in the layers 2200 and 2300 of FIGS. 22 and 23. The primary windings 1420 and the secondary windings 1430 can be separated by one or more layers of the substrate 1400. Typically, the layers of the substrate 1400 are made of the same materials, but it is possible that the layer or layers between the primary windings 1420 and the secondary windings 1430 can be made of a different material.

Figure 17:
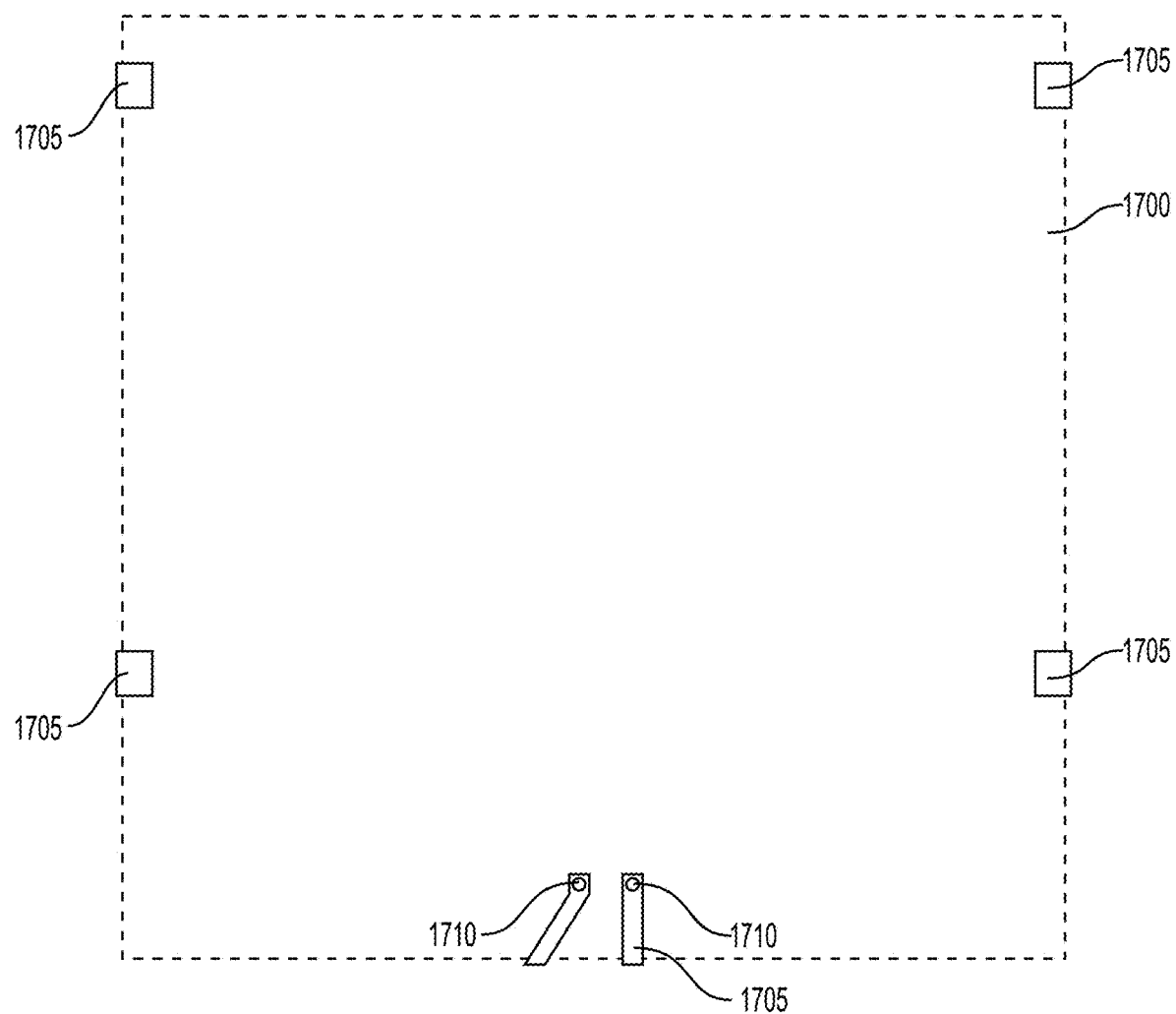
FIGS. 17-26 are plan views of substrate layers used to form the embedded transformer module shown in FIG. 14.
Figure 18:
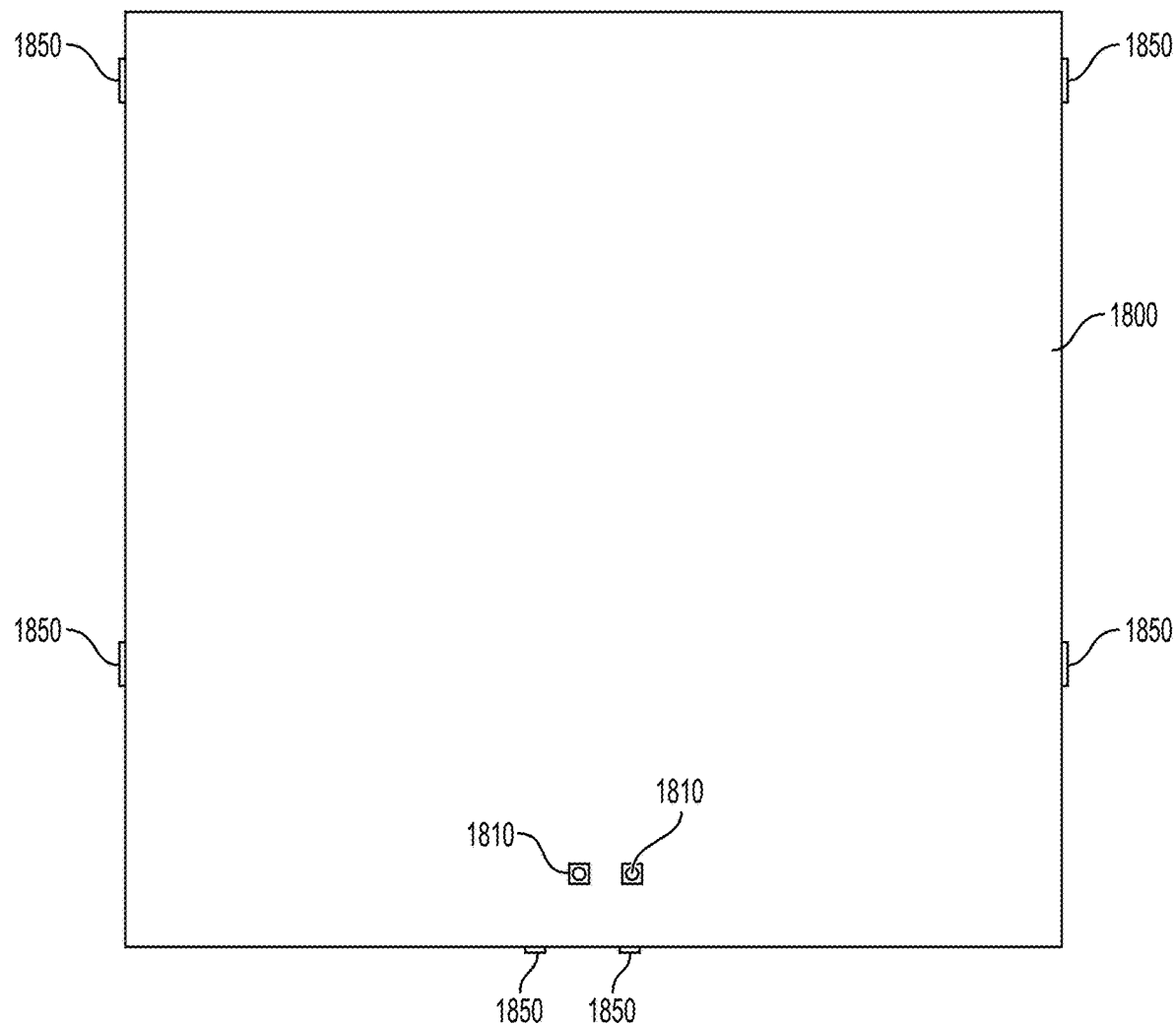

FIG. 17 shows a bottom layer 1700 with metal patterns 1705 and vias 1710. The metal patterns 1705 can be connected to corresponding edge platings on sides of the substrate. FIG. 18 shows a layer 1800 on top of layer 1700 with two vias 1810 and edge plating 1850. The two vias 1810 provide an input and an output of the secondary windings. The two vias 1810 can be located on the same side of the layer 1800 as shown in FIG. 18 or can be located on different sides of the layer 1800.

Figure 19:
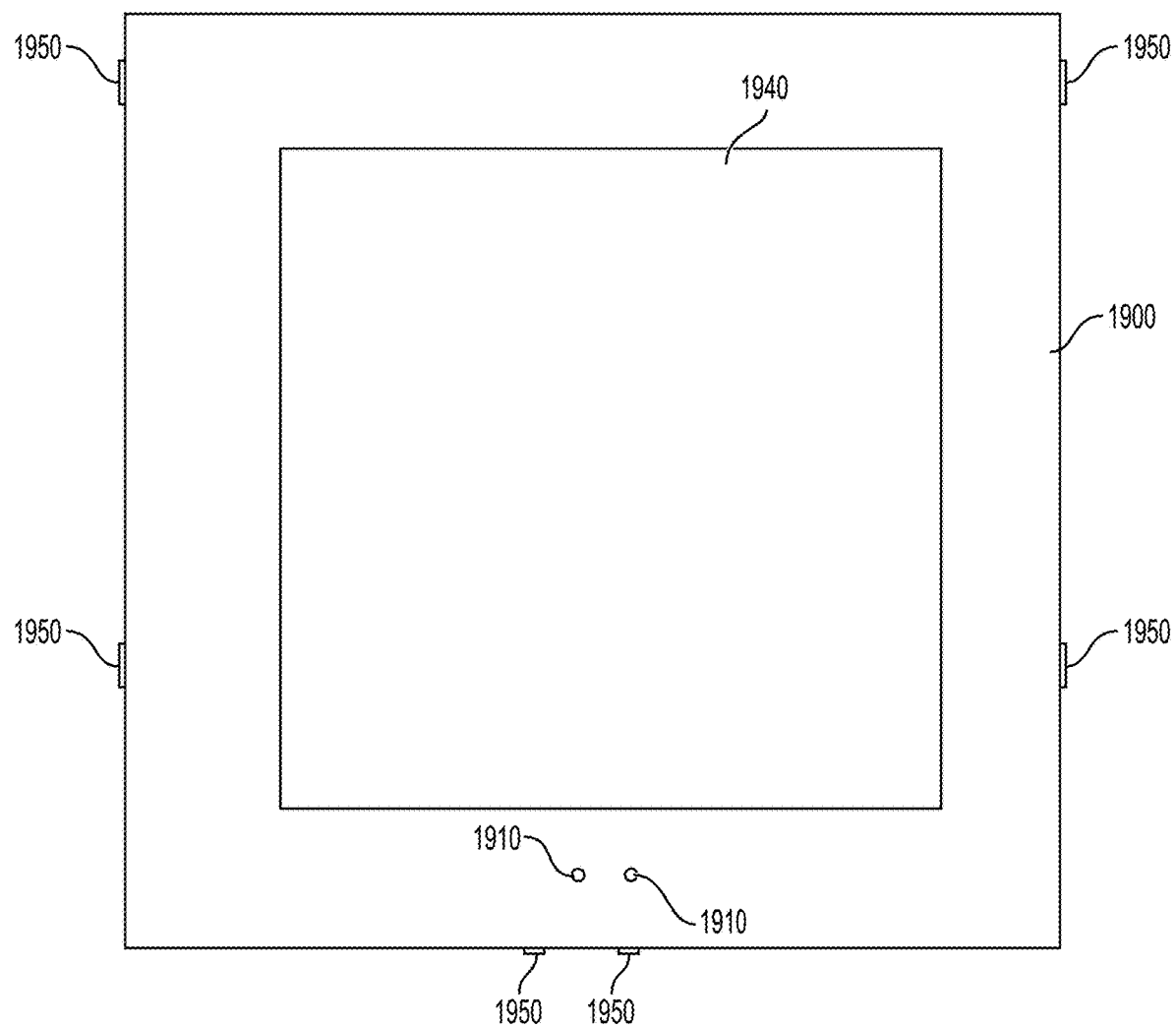

FIG. 19 shows a layer 1900 on top of layer 1800 with vias 1910, a square-shaped magnetic core layer 1940 and edge platings 1950. The magnetic core layer 1940 can be square shaped as shown in FIG. 19 or can be any other suitable shape. If the magnetic core layer 1940 extends over the central pillar and the additional pillars, then closed loops of magnetic flux can be formed.

FIG. 20 shows a layer 2000 on top of layer 1900 with vias 2010 at ends of a spiral-shaped secondary winding 2020 and with edge platings 2050. The magnetic core includes a center pillar 2040 and four additional pillars 2041. The center pillar can be circular as shown in FIG. 20 or can be other suitable shape, including, for example, triangle, square, rectangle, etc. The additional pillars 2041 be triangular-like portions with an arced hypotenuse as shown in FIG. 20 or can be other suitable shapes. The arced hypotenuse of the additional pillars can have a radius of curvature that is slightly larger than the radius of curvature of the closest turn of the secondary winding 2020. The additional pillars 2041 can be arranged to substantially create four corners around the center pillar 2040. Although FIG. 20 shows a circular spiral shape, any shape spiral can be used, including, for example, triangle, square, rectangle, etc. The secondary winding 2020 can include any number of turns, including, for example, more than one turn or at least two turns. The cross-section of the magnetic core 2040 can have the shape of a circle as shown in FIG. 20 or can have any other suitable shape, including, for example, triangle, square, rectangle, etc. The spiral shape of the secondary winding 2020 and the shape of the cross-section of the magnetic core 2040 can be the same or substantially the same within manufacturing tolerances or can be different. The via 2010 in the interior of the secondary winding 2020 can be located on the same side of the layer 2000 as the via 2010 on the exterior of the secondary winding 2020 as shown in FIG. 20 or can be located on different sides of the layer 2000.

Figure 21:
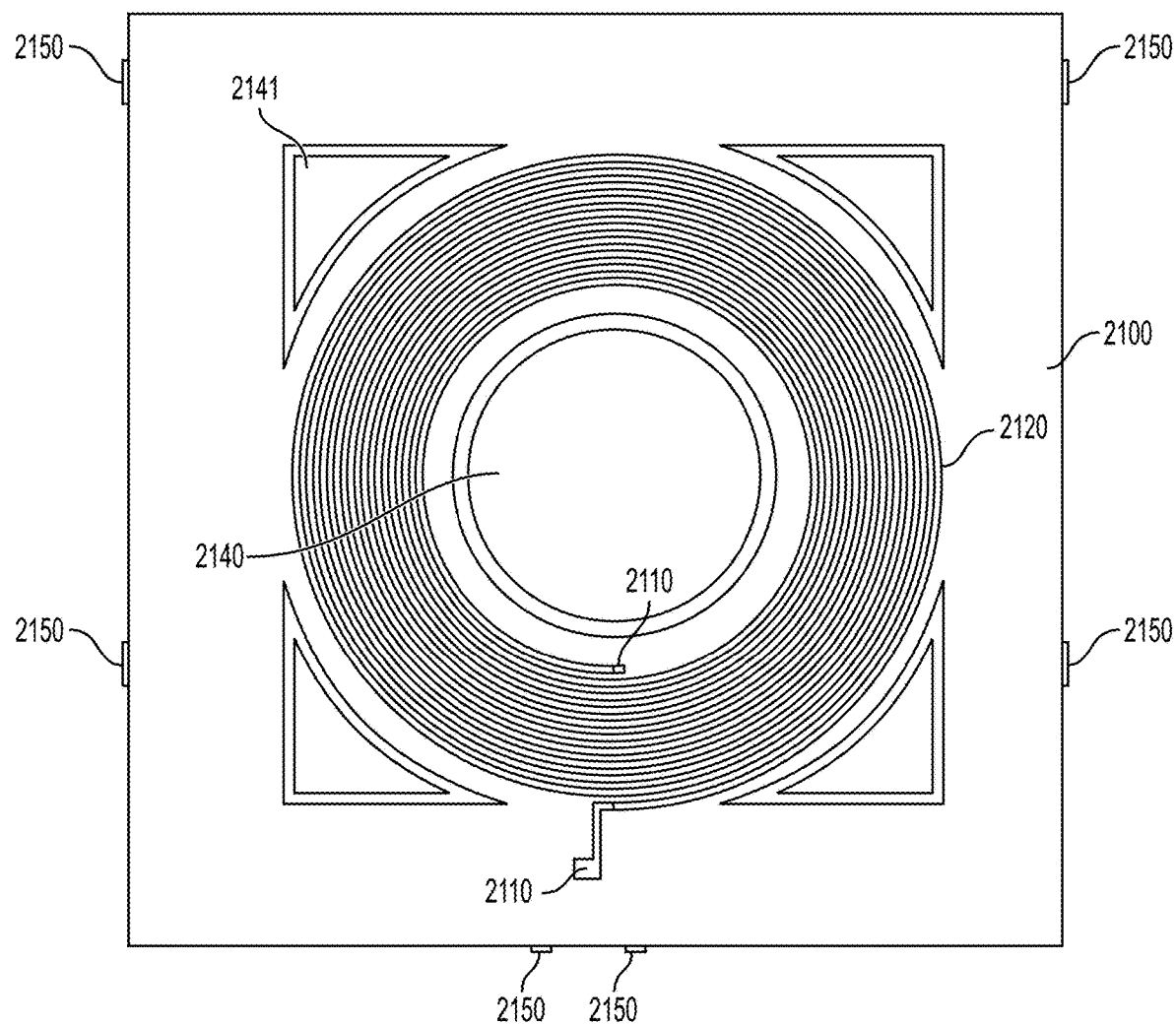

FIG. 21 shows a layer 2100 on top of layer 2000 with vias 2110 at ends of a spiral-shaped secondary winding 2120 that surrounds the center pillar 2140, four additional pillars 2141, and edge platings 2150. The spiral shape of the secondary windings 2020 and 2120 can be the same or substantially the same within manufacturing tolerances or can be different. The number of turns in the secondary windings 2020 and 2120 can be the same or different.

Figure 22:
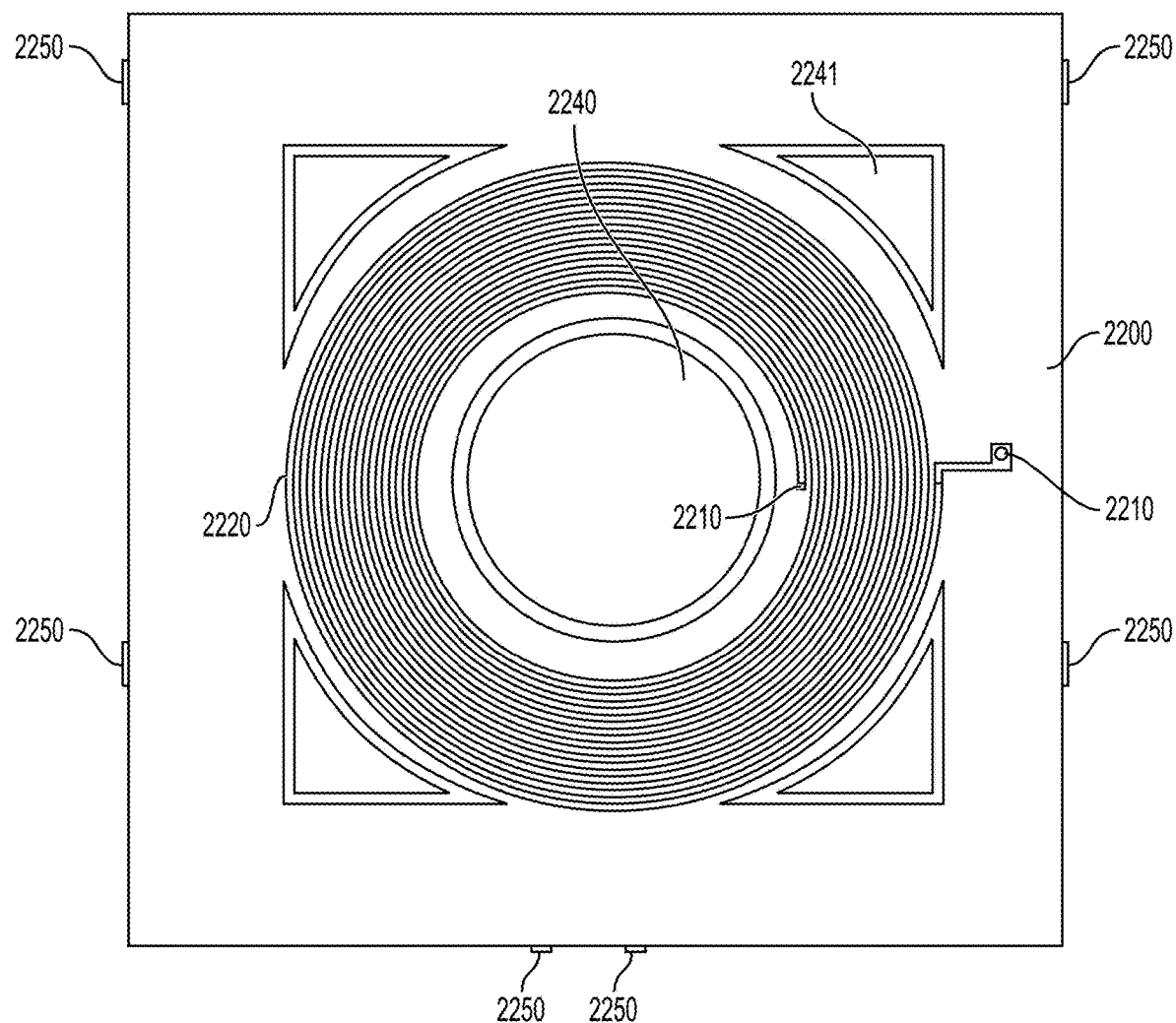

FIG. 22 shows a layer 2200 on top of layer 2100 with vias 2210 at ends of a spiral-shaped primary winding 2220 that surrounds the center pillar 2240, four additional pillars 2241, and edge platings 2250. Although FIG. 22 shows a circular spiral shape, any shape spiral can be used, including, for example, triangle, square, rectangle, etc. The primary winding 2220 can include any number of turns, including, for example, more than one turn or at least two turns. The spiral shape of the primary and secondary windings can be the same or substantially the same within manufacturing tolerances or can be different. The number of turns in the primary and secondary windings can be the same or different.

Figure 23:
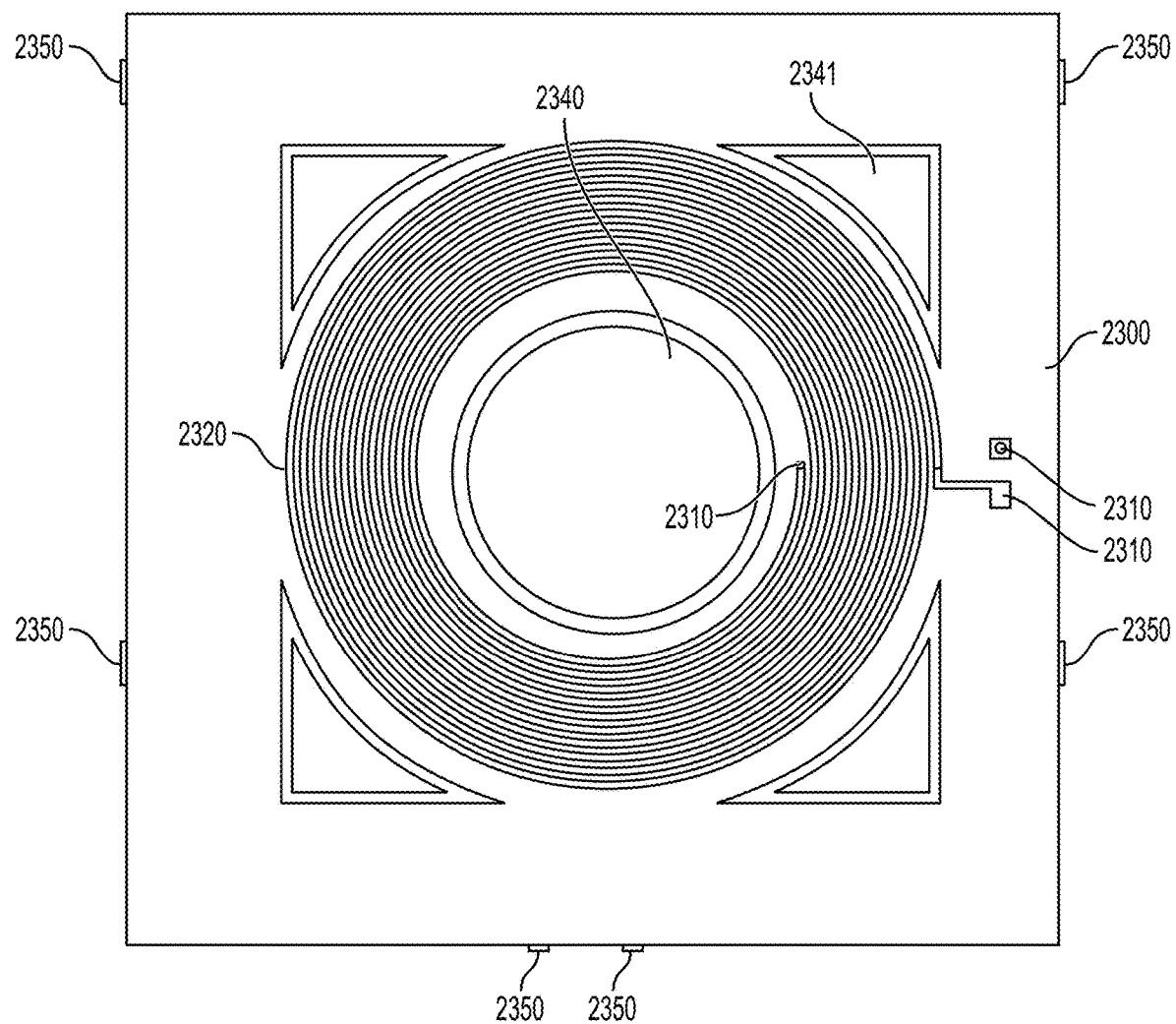

FIG. 23 shows a layer 2300 on top of layer 2200 with vias 2310 at ends of a spiral-shaped primary winding 2320 that surrounds the center pillar 2340, four triangular-like portions of the magnetic core layer 2340, and edge platings 2350. The spiral shape of the primary windings 2220 and 2320 can be the same or substantially the same within manufacturing tolerances or can be different. The number of turns in the primary windings 2220 and 2320 can be the same or different. The via 2310 in the interior of the primary winding 2320 can be located on the same side of the layer 2300 as the via 2310 on the exterior of the primary winding 2320 as shown in FIG. 23 or can be located on different sides of the layer 2300. As shown in FIGS. 19 and 23, the vias 1910 and 2310 can be offset by 90°, but the vias 1910 and 2310 can be offset by any amount.

Figure 24:
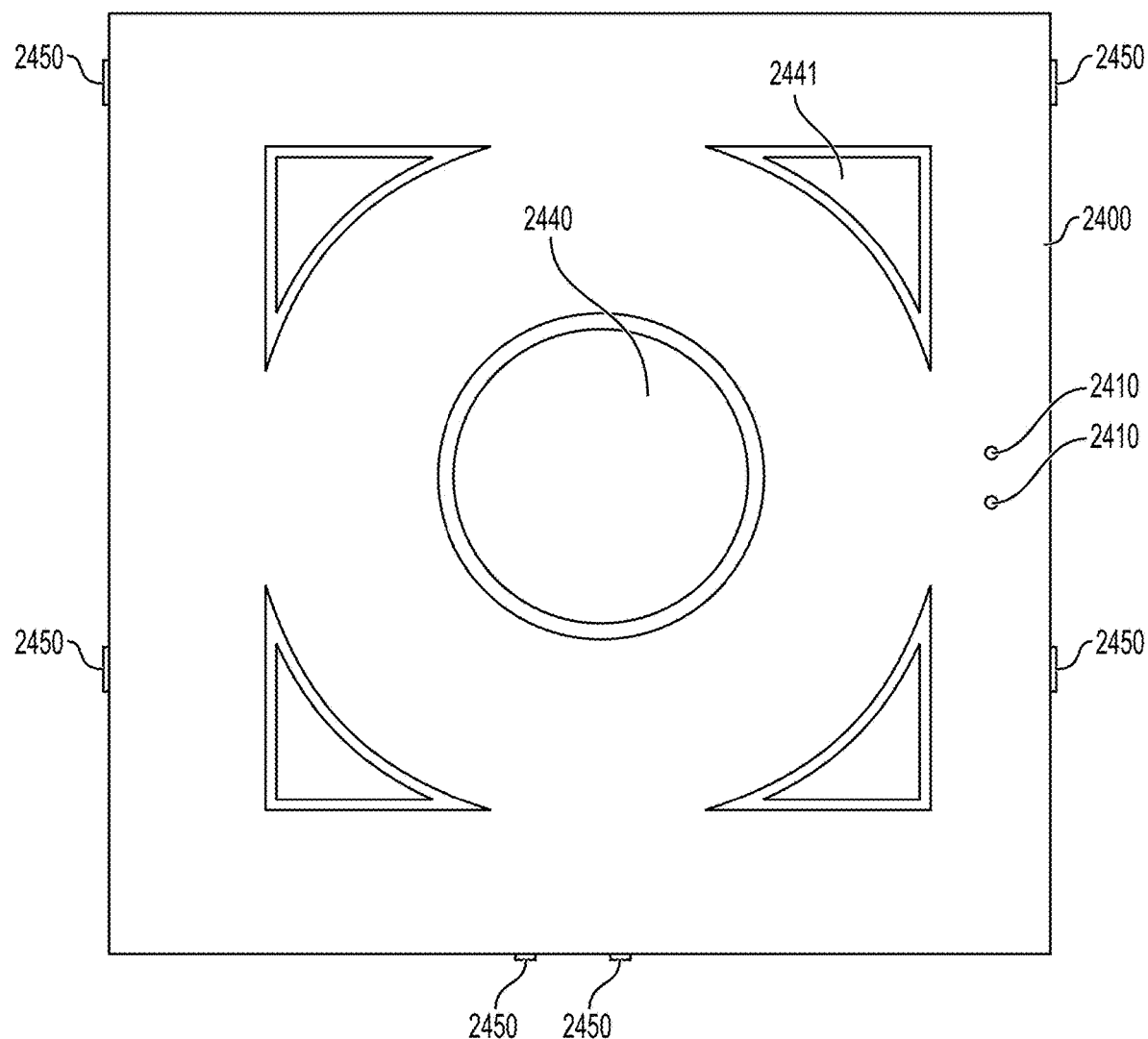

FIG. 24 shows a magnetic core layer 2400 on top of layer 2300 with vias 2410, center pillar 2440, four additional pillars 2441, and edge platings 2450. The two vias 2410 provide an input and an output of the primary windings. The two vias 2410 can be located on the same side of the layer 2400 as shown in FIG. 24 or can be located on different sides of the layer 2400.

Figure 25:
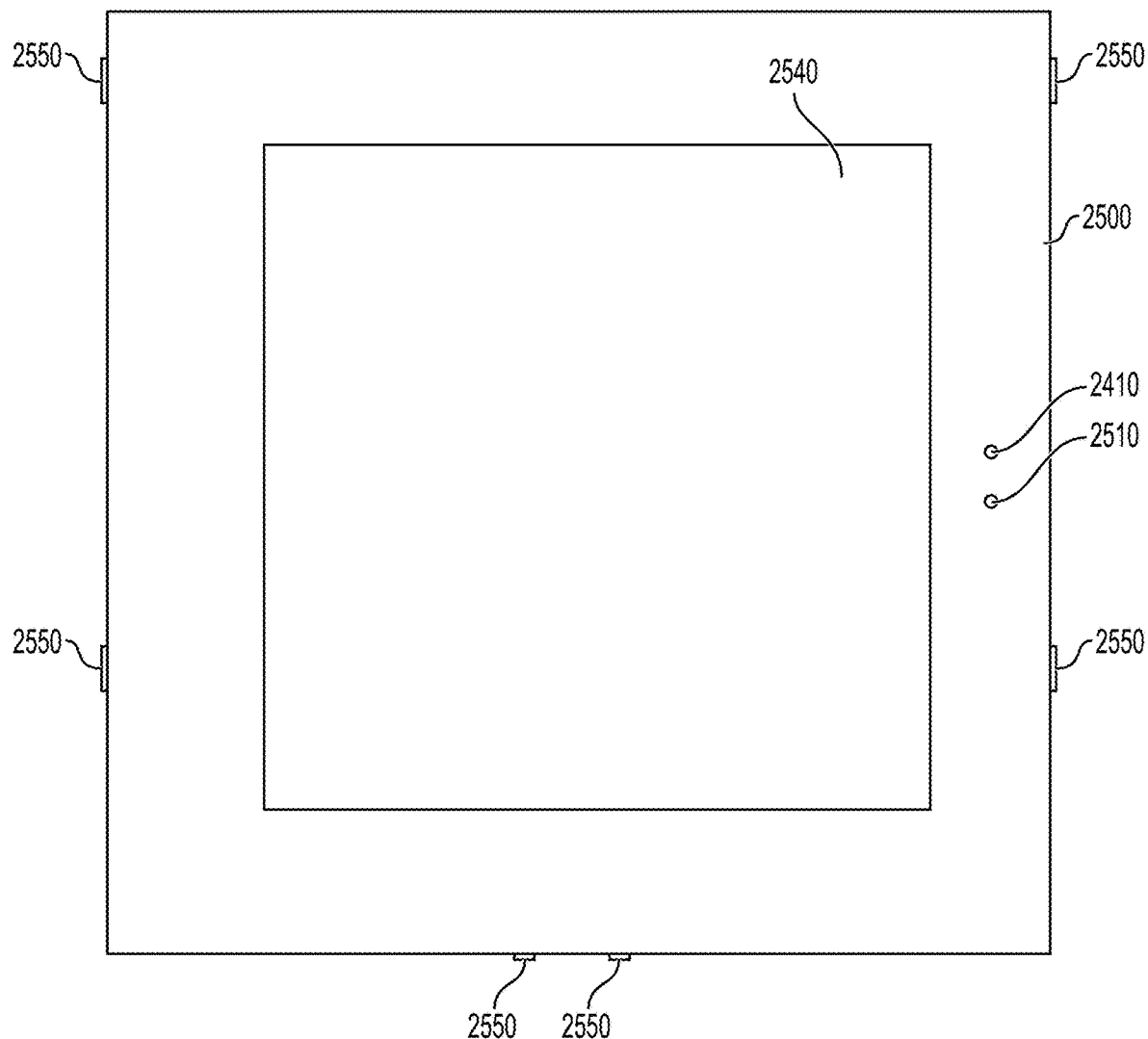
Figure 26:
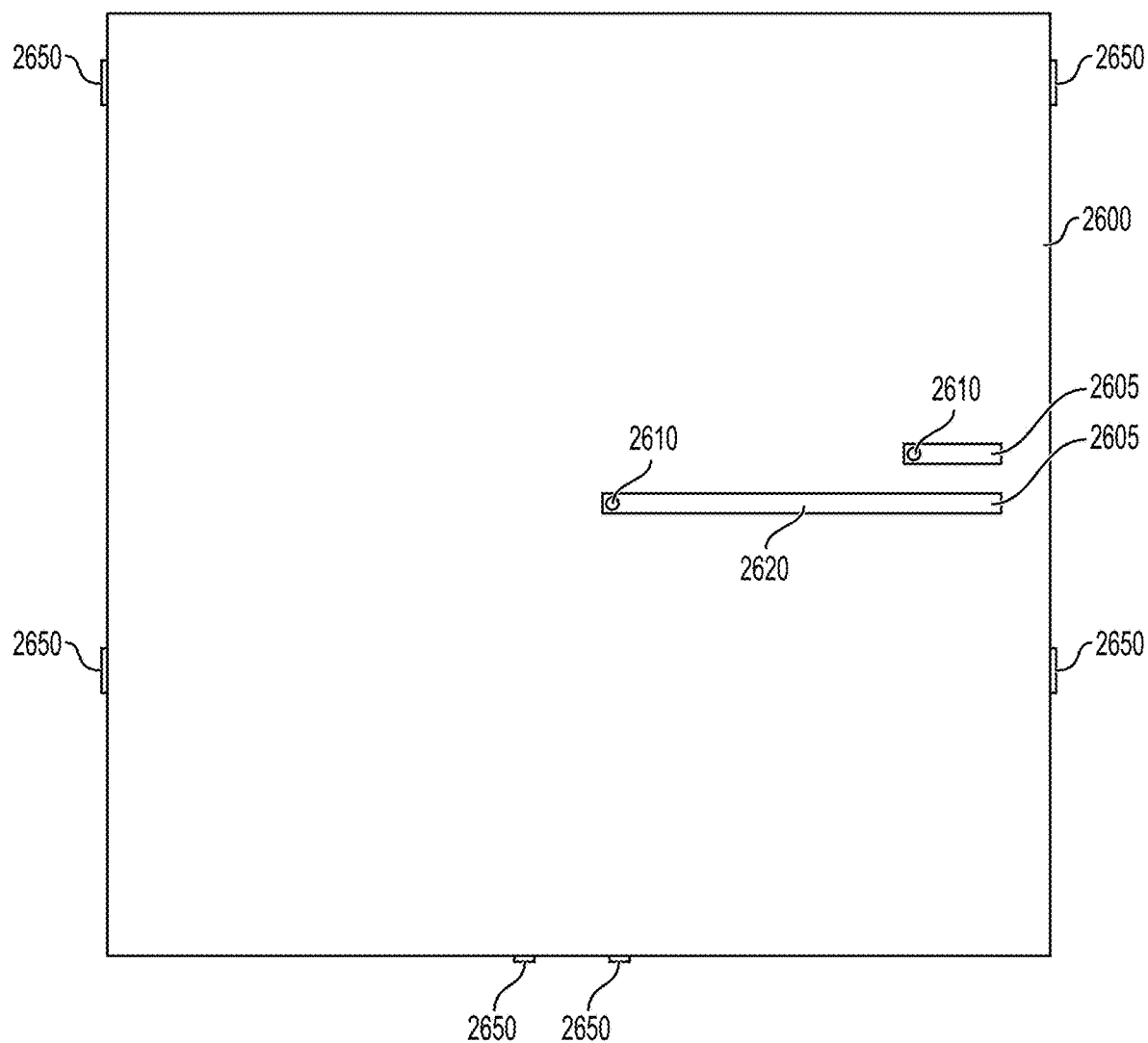

FIG. 25 shows a layer 2500 on top of layer 2400 with vias 2510, a square-shaped magnetic core layer 2540, and edge plating 2550. The magnetic core layer 2540 can be square shaped as shown in FIG. 25 or can be any other suitable shape. If the magnetic core layer 2540 extends over the central pillar and the additional pillars, then closed loops of magnetic flux can be formed. FIG. 26 shows a layer 2600 on top of layer 2500 with metal patterns 2605, vias 2610, and edge platings 2650. The vias 2610 can be connected to traces or other metal layers on the outermost layer(s) of the substrate.

Although not shown, insulation layers are typically included between the winding layers and more than one insulation layer can be included between the primary windings 1420 (including primary windings 2220 and 2320) and the secondary windings 1430 (including secondary windings 2020 and 2120) to provide additional electrical isolation. Additional substrate layers can be included on top and bottom of the layers of the embedded transformer module to include conductive traces and pads used for interconnecting and mounting the primary circuit 1425 and the secondary circuit 1435.

Figure 27A:
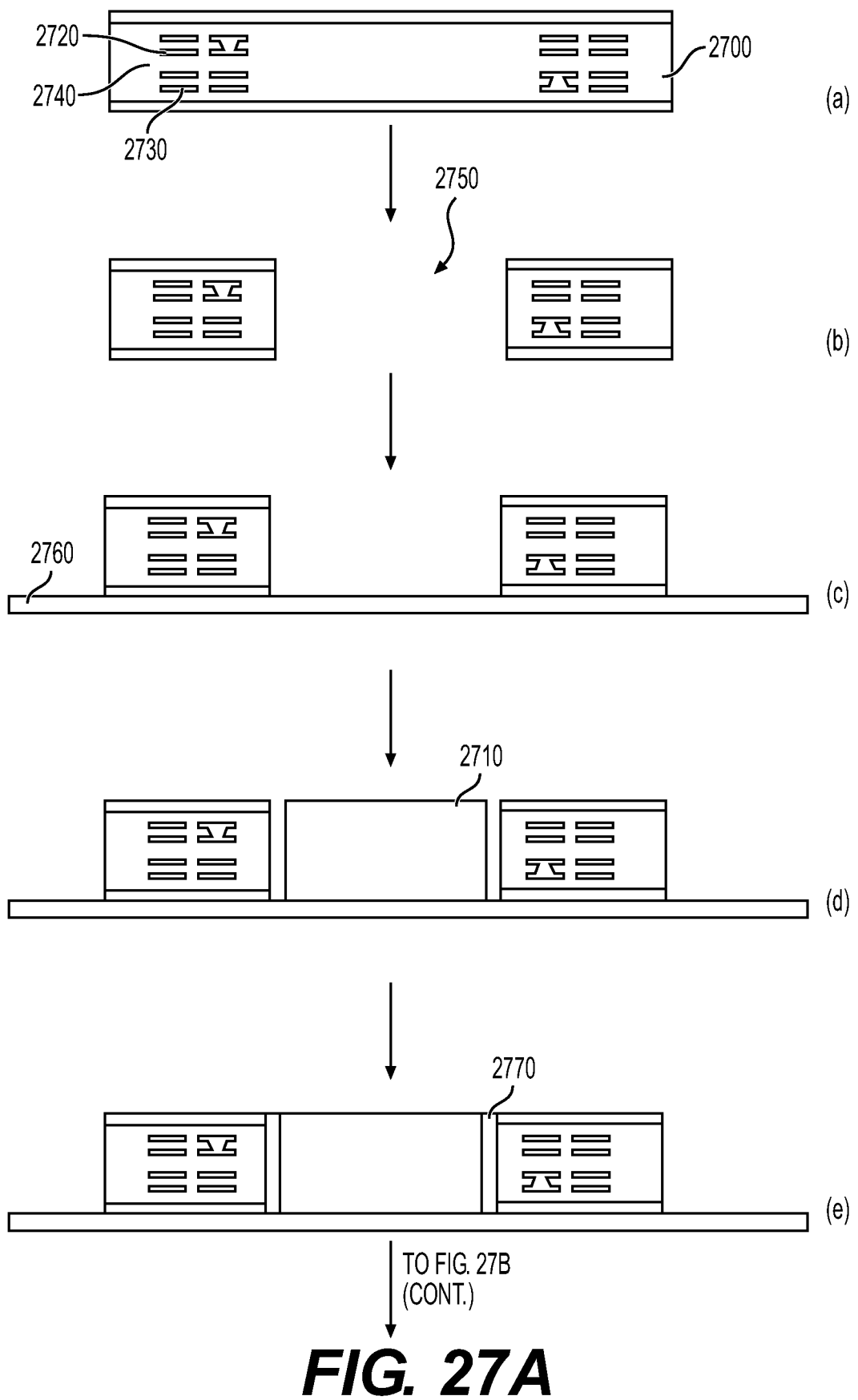
FIGS. 27A and 27B show steps in a process of manufacturing an embedded transformer module like that in FIG. 2.
Figure 27B:
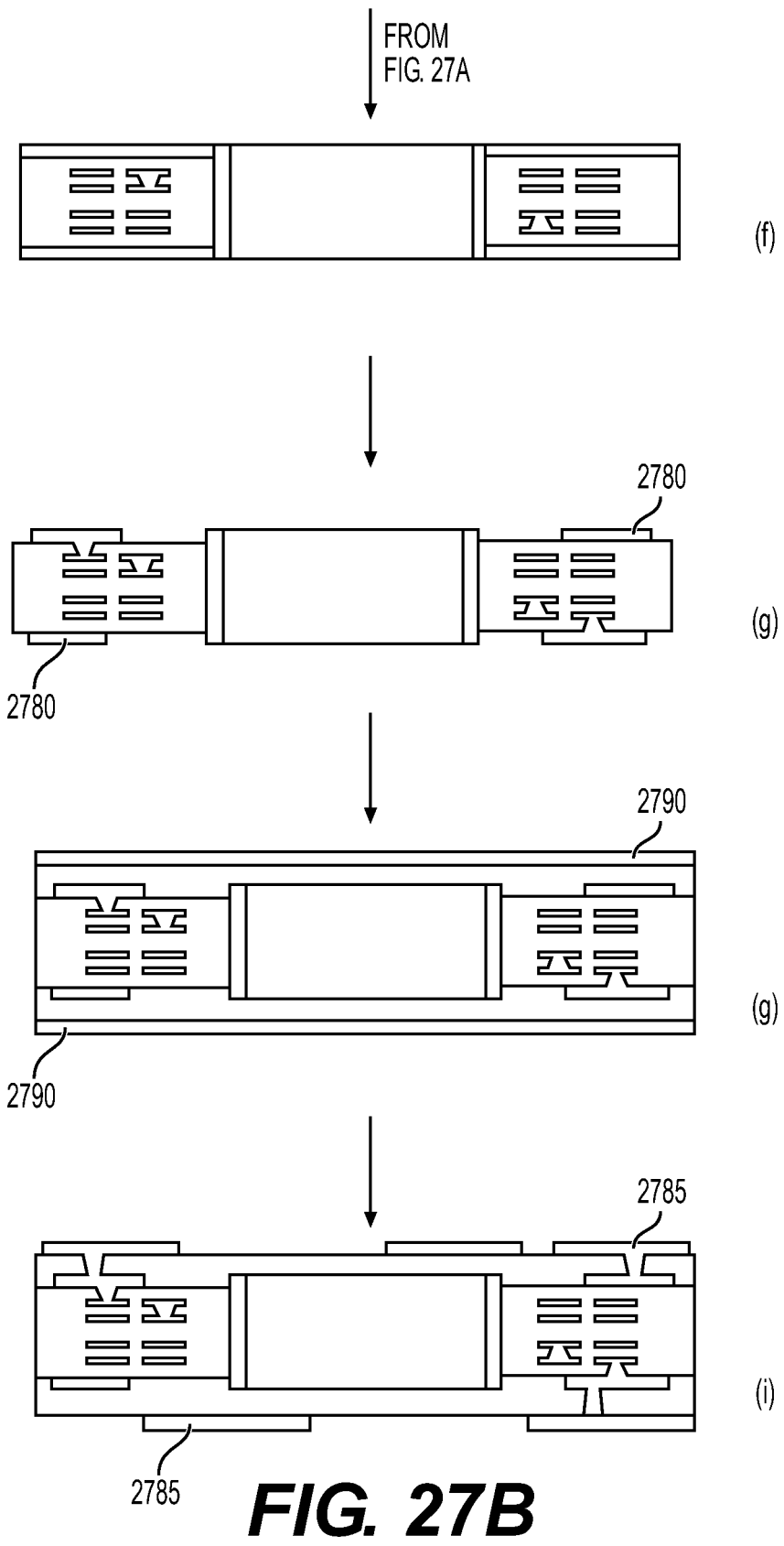

In (a)-(e) of FIG. 27A and (f)-(i) of FIG. 27B, cross section views of steps in a process of manufacturing an embedded transformer module like that in FIG. 2 are shown.

Step (a) shows a substrate 2700 with multiple layers including primary windings 2720, secondary windings 2730, and an insulating layer 2740 between the primary windings 2720 and the secondary windings 2730. The multiple layers in the substrate 2700 can be made using conventional PCB fabrication techniques.

Step (b) shows an opening or cavity 2750 for housing a magnetic core can be created in or through the substrate 2700. The cavity 2750 can be created using any suitable process that might include routing, milling, drilling, punching, ablation, and etching.

In step (c), an adhesive 2760 is attached to one side of the substrate 2700 or bottom of the cavity 2750. The adhesive 2670 can be a sheet with adhering properties on one side.

As shown in step (d), a circular magnetic core 2710 is installed in the cavity 2750 and held in place by the adhesive 2760. The cavity 2750 can be slightly larger than the magnetic core 2710, so that an air gap exists around the magnetic core 2710 and between sides of magnetic core 2710 and the substrate 2700 in the cavity 2750. The magnetic core 2710 can be installed in the cavity 2750 manually or by a surface mounting device such as a pick and place machine.

In the step shown in (e), a resin or suitable material 2770 is provided to fill in the gap between the magnetic core 2710 and the inside substrate wall of the cavity 2750. The resin 2770 can be applied as a liquid or a gel and then cured to harden thus retaining the magnetic core 2710 within the cavity 2750.

After the adhesive 2760 is removed, as shown in step (f), the substrate 2700 can be drilled to provide through holes that can be plated to provide vias that electrically connect layers of the substrate 2700. The through holes can extend partially or entirely from the top layer to the bottom layer of the substrate 2700. As shown in step (g), conductive or metallic traces 2780 can be added to the top and bottom layers of the substrate 2700 to form connection paths to the primary and secondary winding layers 2720, 2730 connecting the respective vias, and in part completing the windings of the embedded transformer and providing connection locations for additional top and bottom substrate layers. The metallic traces 2780 and the plating for the conductive through holes/vias can be made from copper or other suitable material, and can be formed in any suitable way, such as by adding a copper conductor layer to the outer layers by lamination, plating, or printing which can be etched, if necessary, to define the necessary patterns. As shown in step (g), metallic traces 2780 can also formed on the bottom surface of the substrate 2700.

Step (h) shows that additional substrate layers 2790 can be added to the top and bottom surfaces of the substrate 2700 by lamination or any other suitable PCB fabrication technique. The additional substrate layers 2790 can be formed of a material such as FR4, and laminated onto the substrate 2700. Lamination may be via adhesive or via heat activated bonding between layers of pre-preg material. Other materials may be used for the additional substrate layers 2790 and could include a shield layer.

In step (i), the additional substrate layers 2790 can be drilled, printed, plated, and etched to form additional metallic traces 2785 for electrical connection and circuitry routing. These steps can be repeated as necessary to provide trace routing and connections between the embedded transformer module and primary and secondary circuits.

The substrate 2700 can be made of a material other than FR4, such as G10, ceramics, thermoplastics, composites, and epoxies.

The magnetic core 2710 is preferably a ferrite core as this provides the transformer module device with the desired inductance. Other types of magnetic materials, and even air cores, that is an unfilled cavity formed between the windings of the transformer, are also possible. Although, in the steps above, the magnetic core 2710 is circular in shape, it may have a different shape, such as those described with respect to FIGS. 12 and 13. Non-limiting examples include, an oval or elongate toroidal shape, a toroidal shape having a gap, EE, EI, I, EFD, EP, UI and UR core shapes. The magnetic core 2710 can be coated with an insulating material to reduce the possibility of breakdown occurring between the conductive magnetic core 2710 and the conductive vias or metallic traces. The magnetic core 2710 can also have chamfered edges providing a profile or cross section that is rounded.

Additionally, for an embedded transformer with a structure similar to the structure shown in FIGS. 14 and 15 with multiple pillars, separate portions, e.g., different pillars, of the magnetic core can be inserted into cavities in the substrate. For example, for an embedded transformer like that shown in FIG. 14, the separate portions of the magnetic core can include the center pillar 2040 and the four additional pillars 2041 as shown in FIG. 20, or for an embedded transformer like that shown in FIG. 15, the separate portions of the magnetic core can include the first pillar 1510*a* and the second pillar 1510*b*.

Furthermore, although the embedded transformer modules described above use conductive vias to connect the winding and metal trace layers, in alternative preferred embodiments, other connections could be used, such as conductive pins. The conductive pins could be inserted into the through holes or could be preformed at appropriate locations in the substrate 2700 and additional substrate layers. In all the configurations of embedded transformer modules described, an optional solder resist cover may be added to the exterior surfaces of the substrate.

In this description, the terms top, bottom, upper, and lower are used only to define the relative positions of features of the device with respect to each other and in accordance with the orientation shown in the drawings, that is with a notional z axis extending from the bottom of the page to the top of the page. These terms are not therefore intended to indicate the necessary positions of the device features in use, or to limit the position of the features in a general sense.

Example preferred embodiments of the present invention have been described for the purposes of illustration only. These are not intended to limit the scope of protection as defined by the attached claims. Features of one preferred embodiment may be used together with features of another preferred embodiment.

The foregoing description is only illustrative of the present invention. Various alternatives and modifications can be devised by those skilled in the art without departing from the present invention. Accordingly, the present invention is intended to embrace all such alternatives, modifications, and variances that fall within the scope of the appended claims.

The invention claimed is:

1. An embedded transformer module device comprising:
   an insulating substrate including a first side and a second side opposite to the first side and including a first cavity;
   a magnetic core in the first cavity;
   a primary winding wound horizontally around the magnetic core, having a spiral shape with more than one turn, and located on a layer within the insulating substrate;
   a secondary winding wound horizontally around the magnetic core, spaced away from the primary winding, having a spiral shape with more than one turn, and located on a layer within the insulating substrate; and
   a shield layer between the magnetic core and one of the first side and the second side.

2. The device of claim 1, wherein the insulating substrate is a printed circuit board.

3. The device of claim 1, wherein the primary winding and the secondary winding are separated by a plurality of insulating layers of the insulating substrate.

4. The device of claim 1, further comprising:
   a primary circuit connected to the primary winding; and
   a secondary circuit connected to the secondary winding, wherein
   the primary circuit and the secondary circuit are located on one of the first side and the second side.

5. The device of claim 4, further comprising a thermal pillar in a second cavity of the insulating substrate that absorbs heat from one of the primary circuit and the secondary circuit.

6. The device of claim 1, further comprising a resin within the first cavity that secures the magnetic core in the first cavity.

7. The device of claim 1, wherein the primary winding is on two layers of the insulating substrate.

8. The device of claim 1, wherein the secondary winding is on two layers of the insulating substrate.

9. The device of claim 1, wherein the magnetic core includes a pillar.

10. The device of claim 9, wherein the magnetic core includes additional pillars spaced around the pillar.

11. The device of claim 10, wherein the magnetic core includes a first magnetic sheet on top of the pillar and the additional pillars and a second magnetic sheet on bottom of the pillar and the additional pillars.

12. The device of claim 1, wherein
   the magnetic core includes a first pillar and a second pillar;
   the primary winding is wound horizontally around the first pillar; and
   the secondary winding is wound horizontally around the second pillar.

13. The device of claim 12, wherein the magnetic core includes a first magnetic sheet on top of the first pillar and the second pillar and a second magnetic sheet on bottom of the first pillar and the second pillar.

14. An embedded transformer module device, comprising:
- an insulating substrate including a first side and a second side opposite to the first side and including a first cavity;
- a magnetic core in the first cavity;
- a primary winding wound horizontally around the magnetic core, having a spiral shape with more than one turn, and located on a layer within the insulating substrate;
- a secondary winding wound horizontally around the magnetic core, spaced away from the primary winding, having a spiral shape with more than one turn, and located on a layer within the insulating substrate; and
- a shield layer between one of the first side and the second side and each of the magnetic core, the primary winding, and the secondary winding.

* * * * *